(12) United States Patent  (10) Patent No.: US 8,726,202 B2
Wagner  (45) Date of Patent: *May 13, 2014

(54) MITIGATION OF MASK DEFECTS BY PATTERN SHIFTING

(75) Inventor: Alfred Wagner, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 78 days.

This patent is subject to a terminal disclaimer.

(21) Appl. No.: 13/446,369

(22) Filed: Apr. 13, 2012

(65) Prior Publication Data

US 2013/0273463 A1 Oct. 17, 2013

(51) Int. Cl.
*G06F 17/50* (2006.01)

(52) U.S. Cl.
USPC ............. 716/54; 716/50; 716/51; 716/52; 716/55

(58) Field of Classification Search
USPC .................. 716/50, 51, 52, 54, 55
See application file for complete search history.

(56) References Cited

U.S. PATENT DOCUMENTS

| | | | | |
|---|---|---|---|---|
| 4,600,996 | A * | 7/1986 | Kawauchi | 716/51 |
| 6,042,995 | A * | 3/2000 | White | 430/311 |
| 6,118,457 | A | 9/2000 | Ohtsuka et al. | |
| 6,765,673 | B1 | 7/2004 | Higashikawa | |
| 7,171,637 | B2 * | 1/2007 | Stivers | 716/52 |
| 7,678,508 | B2 * | 3/2010 | Kobayashi | 430/5 |
| 7,679,731 | B2 * | 3/2010 | Tezuka | 356/72 |
| 7,927,766 | B2 | 4/2011 | Barrett et al. | |
| 7,941,767 | B2 * | 5/2011 | Mukai et al. | 716/50 |
| 8,139,843 | B2 | 3/2012 | Kulkarni et al. | |
| 8,458,623 | B1 * | 6/2013 | Wagner | 716/51 |
| 2009/0220866 | A1 | 9/2009 | Barrett et al. | |
| 2010/0209828 | A1 | 8/2010 | Sentoku | |
| 2011/0286656 | A1 | 11/2011 | Kulkarni et al. | |
| 2012/0174045 | A1 | 7/2012 | Koshiba et al. | |
| 2012/0257184 | A1 | 10/2012 | Mulkens | |

OTHER PUBLICATIONS

Notice of Allowance dated Feb. 5, 2013 received in a related U.S. Patent Application, U.S. Appl. No. 13/467,191.
Hector, S. et al., "Shifting Pattern Data to Avoid Mask Blank Defects" IP.com Prior Art Database (Nov. 20, 2001) www.ip.com
US Office Action dated Oct. 5, 2012 received in a related US Patent Application, namely U.S. Appl. No. 13/1467,191.

* cited by examiner

*Primary Examiner* — Sun Lin
(74) *Attorney, Agent, or Firm* — Scully, Scott, Murphy & Presser, P.C.; Daniel P. Morris, Esq.

(57) ABSTRACT

An image of a mask pattern is overlaid on an image of a mask blank annotated with the center location and dimensions of each measured mask defect. Design clips centered at the measured defects are generated with lateral dimensions less than allowable movement of the mask pattern over the mask blank. Each design clip is converted into a binary image including pixels corresponding to defect-activating regions and pixels corresponding to defect-hiding regions. Each pixel region representing the defect-activating region is expanded by laterally biasing peripheries by one half of the lateral extent of the defect located within the corresponding design clip. Biased design clips are logically compiled pixel by pixel to determine an optimal pattern shift vector representing the amount of pattern shift.

25 Claims, 29 Drawing Sheets

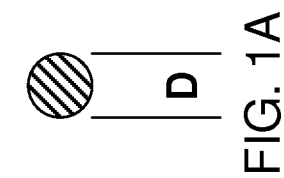
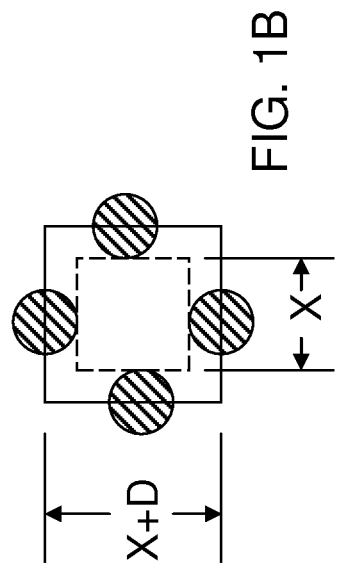
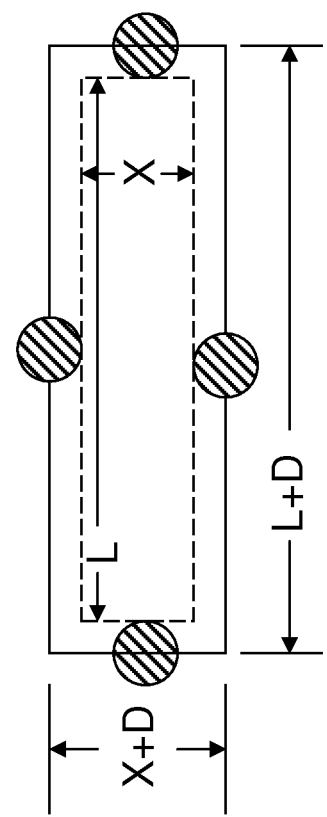

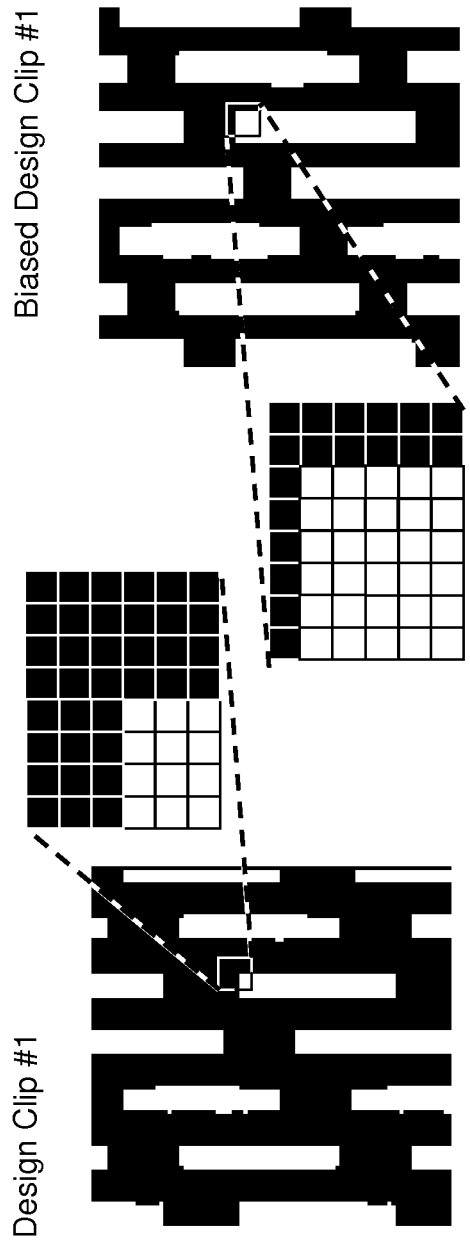
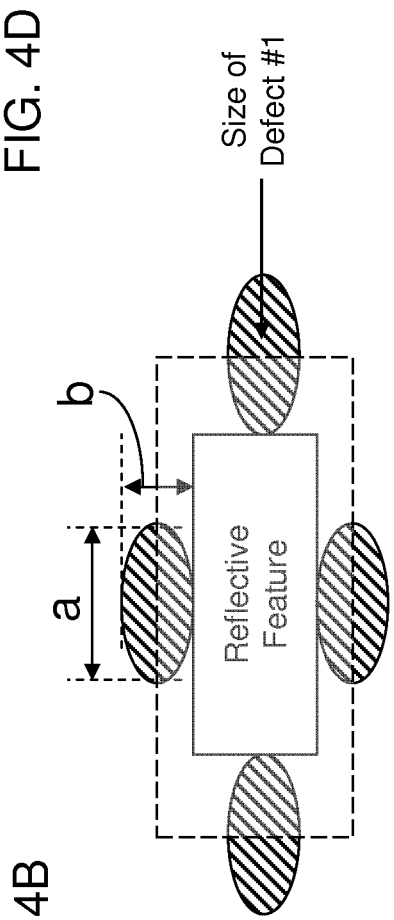
FIG. 4D
FIG. 4C
FIG. 4B

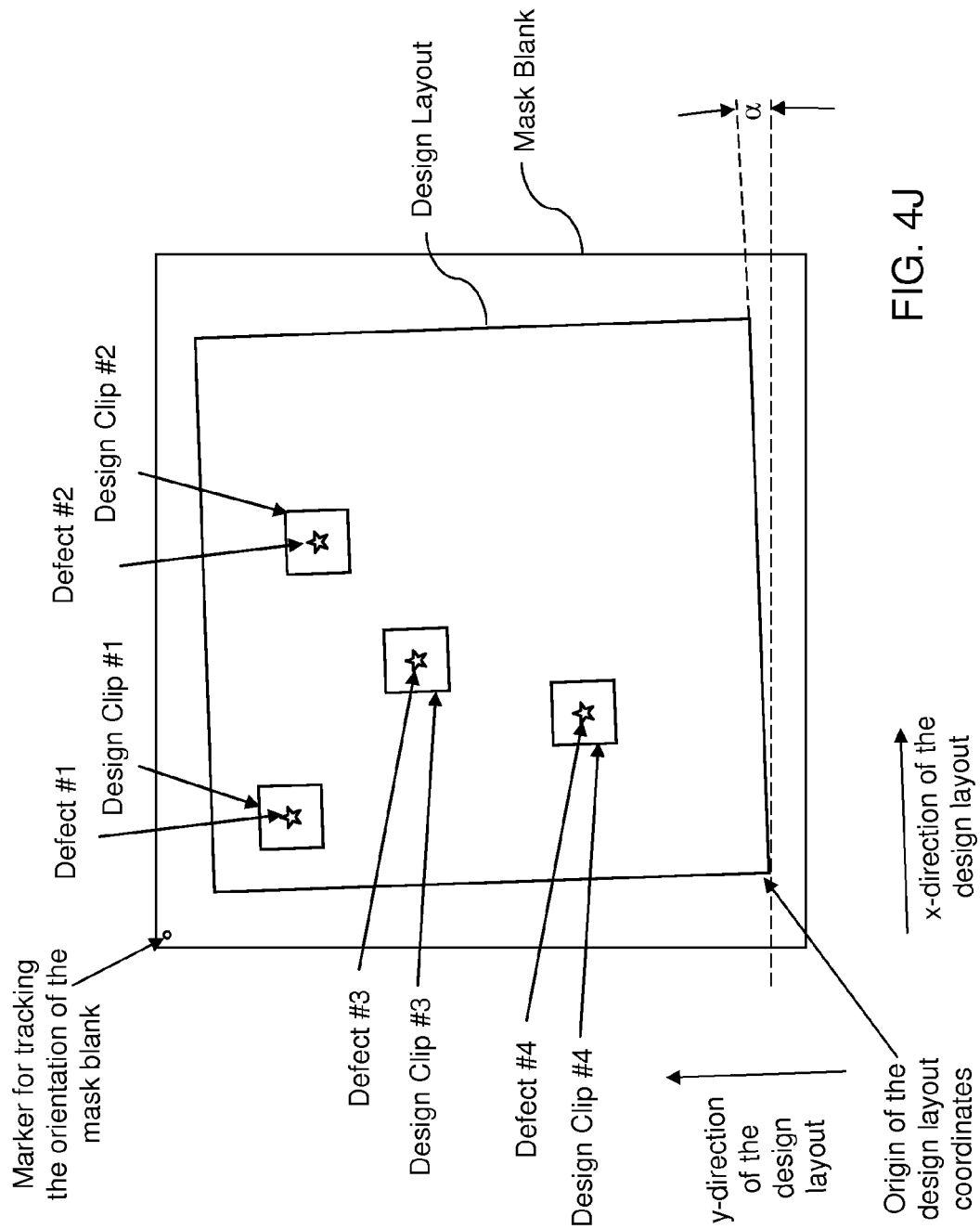

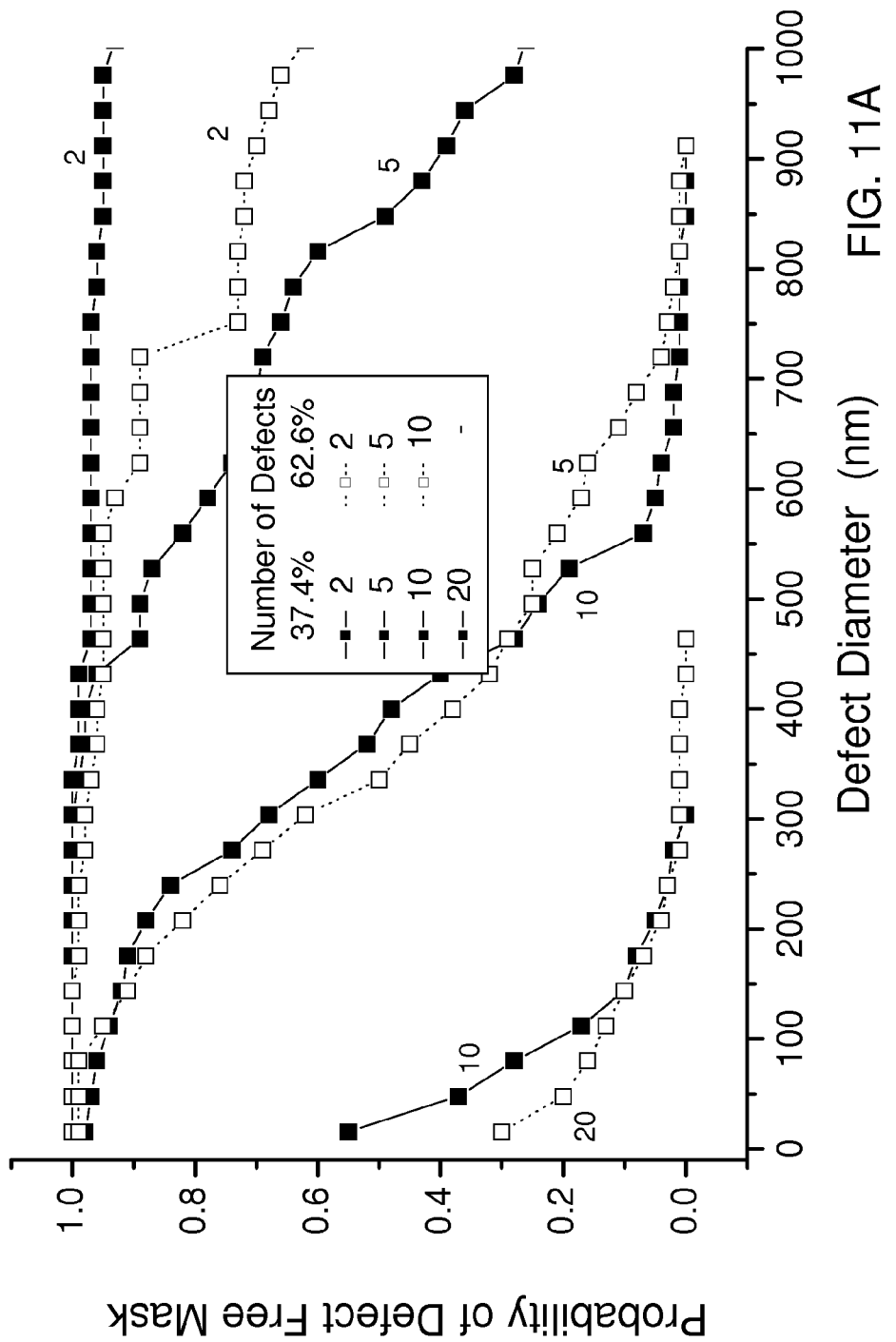

MITIGATION OF MASK DEFECTS BY PATTERN SHIFTING

BACKGROUND

The present disclosure relates to a methodology for mitigating mask defects by pattern shifting and a system for implementing the same.

Currently, the mask blanks used in Extreme Ultraviolet (EUV) Lithography cannot be fabricated free of defects. A rapid method of determining the optimum placement of mask patterns on the blank to avoid these defects is described. Using this method, the probability of fabricating defect free masks when the pattern is 1) randomly placed on the mask blank, or 2) positioned optimally to avoid defects, is determined for a variety of integrated circuit designs, defect densities, and defect sizes. In addition to circular defects, oval and clusters of defects are also considered. Finally, simple analytical expressions for the probability of obtaining a defect free mask in the case of random placement of the mask pattern is presented and compared to Monte Carlo simulations.

Photomasks used in conventional optical lithography consist of a fused silica substrate with a patterned optical absorber on the surface. Open regions in the absorber transmit light, typically at 193 nm wavelength, which is imaged onto a silicon wafer. This simple structure coupled with many decades of manufacturing experience has resulted in mask blanks (fused silica with unpatterned absorber) that are substantially free of defects. However, the photomask used in Extreme Ultraviolet Lithography is much more complex, consisting of a fused silica substrate, a distributed Bragg reflector containing ~50 alternating layers of silicon and molybdenum, a thin capping layer, and finally a patterned absorber layer. In this case, open regions in the absorber reflect the EUV light which is then imaged onto the silicon wafer.

Due to the very short wavelength of 13.6 nm employed in EUV lithography, nanometer scale differences in optical path length produce printable phase defects. Hence, minor pits or bumps in the fused silica substrate of only a few nanometers in height can propagate thru the multilayer mirror and result in printable phase defects. In addition, nanometer scale particles or growth defects embedded in the multilayer minor can also produce printable defects. Thus it is inherently more difficult to fabricate a defect free mask blank for EUV lithography than conventional optical lithography. As a result, EUV mask blanks currently contain numerous defects, a situation which is likely to continue for the foreseeable future.

While several methods for repairing EUV blank defects have been described, a reliable method of repairing every EUV blank defect is not available.

BRIEF SUMMARY

A mask pattern can be positioned on a mask blank such that all defects on the mask blank are placed under an absorber layer, thereby causing a patterned mask to appear to be defect free. An optimum location of the mask pattern with respect to the defects in the mask blank is determined, and the mask pattern is subsequently shifted on the blank to avoid deleterious lithographic effects due to all of the defects present within the mask blank.

A mask blank is inspected to determine the location and size of each measurable defect thereupon. An image of a mask pattern to be formed on the mask blank is overlaid with an image of the mask blank annotated with the center location of each measured mask defect and the extent of each defect along two orthogonal directions. Design clips having a same peripheral shape are generated from image of the mask pattern for the measured defects. Each design clip is centered at the center of each measured defect, and is limited in size so that the magnitude of a vector from the center of a measured defect to any point on the periphery of the corresponding design clip is less than the maximum allowable movement of the image of the mask pattern relative to the mask blank along the direction of the vector. Each design clip is converted into a binary image including pixels representing defect-activating regions, which correspond to a reflective region of an EUV mask or a transparent region of a DUV mask and can be represented, e.g., by "1," and pixels corresponding to defect-hiding regions, which correspond to an absorber region of the EUV mask or an opaque region of the DUV mask and can be represented, e.g., by "0." Each pixel region representing a defect-activating region, e.g., a reflective region or a transparent region, is expanded by laterally biasing peripheries of that pixel region by one half of the lateral extent of the defect located within the same design clip. Biased design clips are logically compiled pixel by pixel, for example, by an "OR" logic operation or a numerical addition of bit values, to determine an optimal pattern shift vector representing the amount of pattern shift that eliminates or minimizes the impact of the measured defects on a manufactured patterned mask.

In one embodiment, the overlaying of the image of the mask pattern and the annotated image of the mask blank can be performed at least twice after each rotation of the image of the mask pattern relative to the image of the mask blank until an optimal pattern shift vector that satisfies a predetermined criterion can be found, or a predetermined computation time is used up.

In one embodiment, the optimal pattern shift vector can be required to place all defects within the reflective region or the transparent region, or can be required to minimize the number of defects that are not placed within the reflective region or the transparent region.

According to an aspect of the present disclosure, a method for determining placement of a mask pattern with respect to a mask blank is provided. The method includes: overlaying an image of a mask pattern over an image of a mask blank annotated with a center location and at least one dimension parameter of each of measured mask defects; generating design clips centered at each of the measured defects and having a same design clip size and a same design clip shape from the image of the mask pattern; generating a binary pixel image for each of the design clips; logically compiling, pixel by pixel, the generated binary pixel images to generate a composite pixel map; and determining, from the composite pixel map, presence or absence of a pattern shift vector representing a lateral shift of the mask blank from a position at the overlaying, the lateral shift being selected to eliminate or minimize an impact of the measured mask defects during a lithographic process employing a pattern mask generated from the mask blank and including the mask pattern, wherein a computing means configured to run an automated program performs at least one of the overlaying, the generating of the design clips, the generating of the binary pixel images, the logically compiling, and the determining.

According to another aspect of the present disclosure, a method of manufacturing a patterned mask from a mask blank is provided. The method includes: overlaying an image of a mask pattern over an image of a mask blank annotated with a center location and at least one dimension parameter of each of measured mask defects; generating design clips centered at each of the measured defects and having a same design clip size and a same design clip shape from the image of the mask pattern; generating a binary pixel image for each of the design clips; logically compiling, pixel by pixel, the generated binary pixel images to generate a composite pixel map; identifying, from the composite pixel map, a pattern shift vector representing a lateral shift of the mask blank from a position at the overlaying, the lateral shift being selected to eliminate or minimize an impact of the measured mask defects during a lithographic process; loading the mask blank into a mask writing tool; aligning the mask blank in the mask writing tool with a physical offset corresponding to the pattern shift vector; and printing, with the physical offset, the image of the mask pattern on the mask blank to convert the mask blank into a patterned mask.

According to yet another aspect of the present disclosure, a system for determining placement of a mask pattern with respect to a mask blank, the system includes a computing means and a non-transitory machine readable data storage medium. The computing means includes a processor and a memory in communication with the processor, and is configured to perform a method including steps of: overlaying an image of a mask pattern over an image of a mask blank annotated with a center location and at least one dimension parameter of each of measured mask defects; generating design clips centered at each of the measured defects and having a same design clip size and a same design clip shape from the image of the mask pattern; generating a binary pixel image for each of the design clips; logically compiling, pixel by pixel, the generated binary pixel images to generate a composite pixel map; and determining, from the composite pixel map, presence or absence of a pattern shift vector representing a lateral shift of the mask blank from a position at the overlaying, the lateral shift being selected to eliminate or minimize an impact of the measured mask defects during a lithographic process. The non-transitory machine readable data storage medium is in communication with the computing means and is configured to store information on the pattern shift vector in a non-transitory machine readable medium.

According to yet another aspect of the present disclosure, a system for determining placement of a mask pattern with respect to a mask blank is provided. The system includes a computing means and a mask writing tool. The computing means includes a processor and a memory in communication with the processor and is configured to perform a method including steps of: overlaying an image of a mask pattern over an image of a mask blank annotated with a center location and at least one dimension parameter of each of measured mask defects; generating design clips centered at each of the measured defects and having a same design clip size and a same design clip shape from the image of the mask pattern; generating a binary pixel image for each of the design clips; logically compiling, pixel by pixel, the generated binary pixel images to generate a composite pixel map; and identifying, from the composite pixel map, a pattern shift vector representing a lateral shift of the mask blank from a position at the overlaying, the lateral shift being selected to eliminate or minimize an impact of the measured mask defects during a lithographic process. The mask writing tool is in communication with the computing means and is configured: to load the mask blank and to align the mask blank in the mask writing tool with a physical offset corresponding to the pattern shift vector; and to print, with the physical offset, the image of the mask pattern on the mask blank to convert the mask blank into a patterned mask.

BRIEF DESCRIPTION OF THE SEVERAL VIEWS OF THE DRAWINGS

FIG. 1A is a schematic illustration of a circular particle that constitutes a defect on a mask blank.

FIG. 1B is a schematic showing the region where a defect of diameter D will not reside inside a desired feature on the photomask for a contact level or via level mask pattern.

FIG. 1C is a schematic showing the region where a defect of diameter D will not reside inside a desired feature on the photomask for a line level mask pattern or a tone-reversed gate conductor level.

FIG. 4B is a binary pixel image of a first design clip centered at the center of the first defect after binarization according to an embodiment of the present disclosure.

FIG. 4C is an illustration of a process for biasing a defect-activating region in a binary pixel image according to an embodiment of the present disclosure.

FIG. 4D is a biased binary pixel image generated from the binary pixel image of the first design clip by the process of biasing according to an embodiment of the present disclosure.

FIG. 4J is an illustration in which the area of a design layout is overlaid over the area of a mask blank including N defects after rotating the design layout by cc degrees relative to the mask blank, and design clips centered at each center of defects have been generated from the design layout according to an embodiment of the present disclosure.

FIG. 11A is a graph illustrating the impact on defect mitigation of inverting the tone of the mask pattern of a 32 nm node gate conductor (GC) level mask pattern having an average reflective area greater than 50%.

DETAILED DESCRIPTION

Figure 2A:
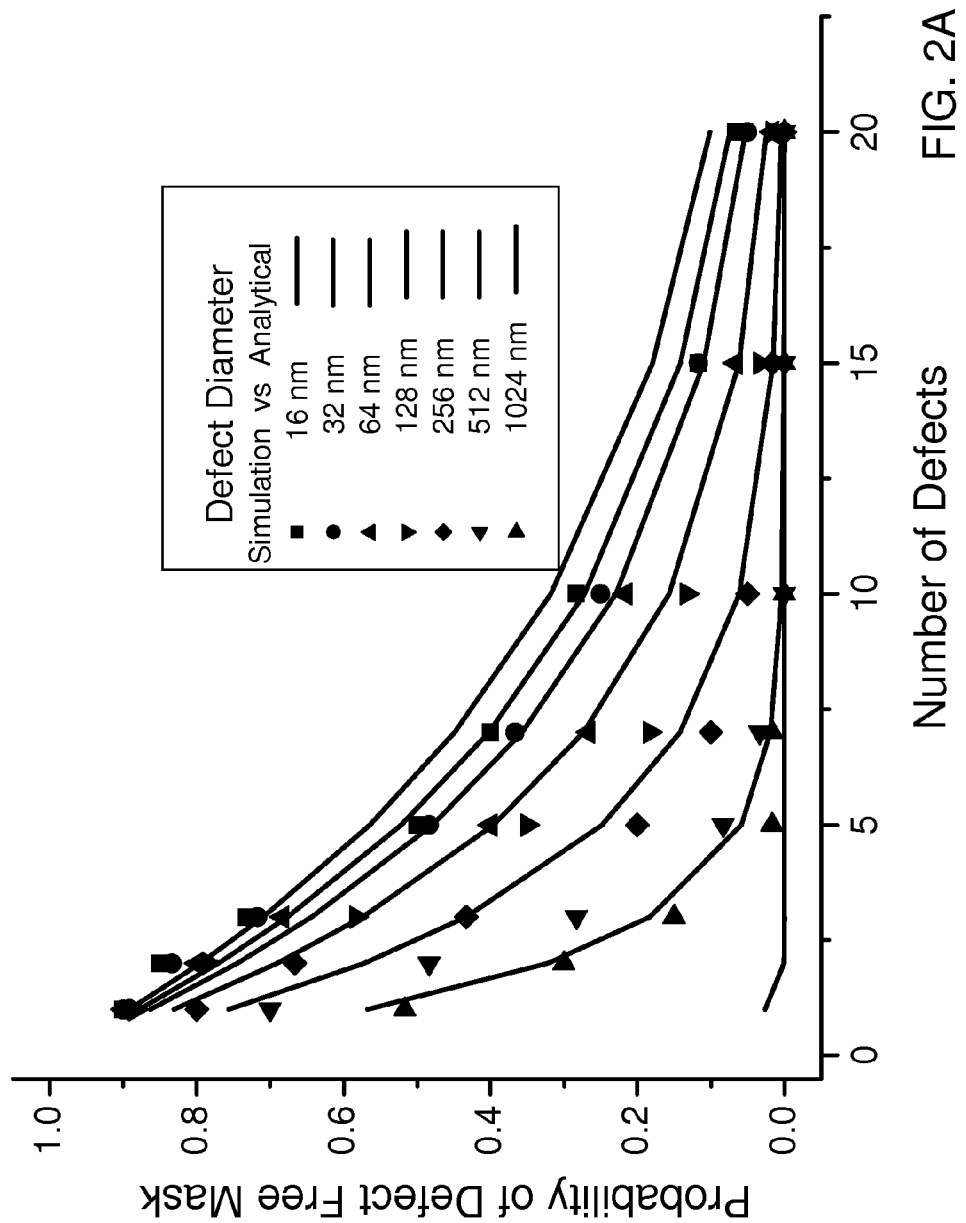
FIG. 2A is a graph illustrating the probability of producing a defect free mask without pattern shifting, as a function of number of defects and defect diameter, for a 65 nm node contact level mask having 10.8% reflective areas. The points represent the results of Monte Carlo simulations, while the solid lines are analytical calculations derived from Eq. (5).

As stated above, the present disclosure relates to a methodology for a methodology for mitigating mask defects by pattern shifting and a system for implementing the same, which are now described in detail with accompanying figures. Like and corresponding elements mentioned herein and illustrated in the drawings are referred to by like reference numerals. The drawings are not necessarily drawn to scale.

As used herein, a "design clip" refers to a subset of a design layout for a semiconductor chip that is less than the entirety of the design layout.

As used herein, a "unit grid dimension" is the unit dimension of a grid employed to design a design layout.

As used herein, a "node" of a particular dimension, e.g., 65 nm node, 45 nm node, 32 nm node, refers to a technology node employed in semiconductor industry that employs the particular dimension as a nominal dimension for lithographically printable minimum features.

As used herein, a "defect-hiding" region is an absorber region of an extreme ultraviolet (EUV) mask, an opaque region of a deep ultraviolet (DUV) mask, or a region of any other lithographic mask in which deleterious effect of a defect is otherwise minimized.

As used herein, a "defect-activating" region is a refractive region of an extreme ultraviolet (EUV) mask, a transparent region of a deep ultraviolet (DUV) mask, or a region of any other lithographic mask in which deleterious effect of a defect is otherwise activated, i.e., brought into physical manifestation during a lithographic process.

As used herein, an element is "configured" to perform a task if the elements includes hardware or a combination of hardware and software that inherently enable performance of the task.

Typically, a photomask pattern is written in the center of a mask blank. In this case, randomly occurring defects in the blank may or may not fall within open (reflective) features in the pattern. For illustrative purposes, a simple analytical expression for the mask yield is described and compared to Monte Carlo simulations. The probability of an infinitesimally small, randomly placed defect landing within a reflective mask feature is simply equal to Ar, the average fractional open area in the mask pattern, i.e. the average reflective area. If the mask blank has "N" defects, then the probability P that all "N" defects will fall under the absorber is given by:

$$P = (1-A_r)^N \qquad \text{Eq. (1)}$$

Here, P represents the probability of fabricating a defect free mask. If the defects are not infinitesimally small, but rather have a diameter "D", then Eq. (1) needs to be modified.

FIG. 1A illustrates a circular defect having a diameter of D. FIGS. 1B and 1C illustrate two exemplary cases. In FIG. 1B, mask patterns consisting of square reflective regions of size "X" on a side is shown. This pattern is representative of contact or via level mask levels. While the area of a contact is simply equal to $X^2$, the region from which a defect of diameter "D" must be excluded is equal to $(X+D)^2$. Thus, the effective average fractional reflective area $A_{eff}$ on the mask (i.e. region from which defects must be excluded) for a contact or via level mask is given by:

$$A_{eff} = A_r \times \{(X+D)/X\}^2. \qquad \text{Eq. (2)}$$

Referring to FIG. 1C, a mask pattern is shown, which consist of long rectangular features of length L, with a small dimension equal to X. This pattern is representative of metal or tone-reversed gate mask levels. In this case, the effective average fractional reflective area is given by:

$$A_{eff} = A_r \times (X+D) \times (L+D)/(X \times L). \qquad \text{Eq. (3)}$$

Since the length "L" of the features in typical metal and gate levels is generally much longer than the width X of the features, Eq. (3) can be approximated for defects of modest size by:

$$A_{eff} \cong A_r \times (X+D)/X. \qquad \text{Eq. (4)}$$

Eliminating "L" from Eq. (3) is advantageous since it eliminates a mask parameter which is difficult to characterize with a single number for a given technology node. Thus, the probability P of fabricating a defect free mask using a blank with "N" defects of diameter "D" is simply given by:

$$P = (1 - A_{eff})^N. \qquad \text{Eq. (5)}$$

where $A_{eff}$ is given by either Eq. (2) or Eq. (4).

Figure 2B:
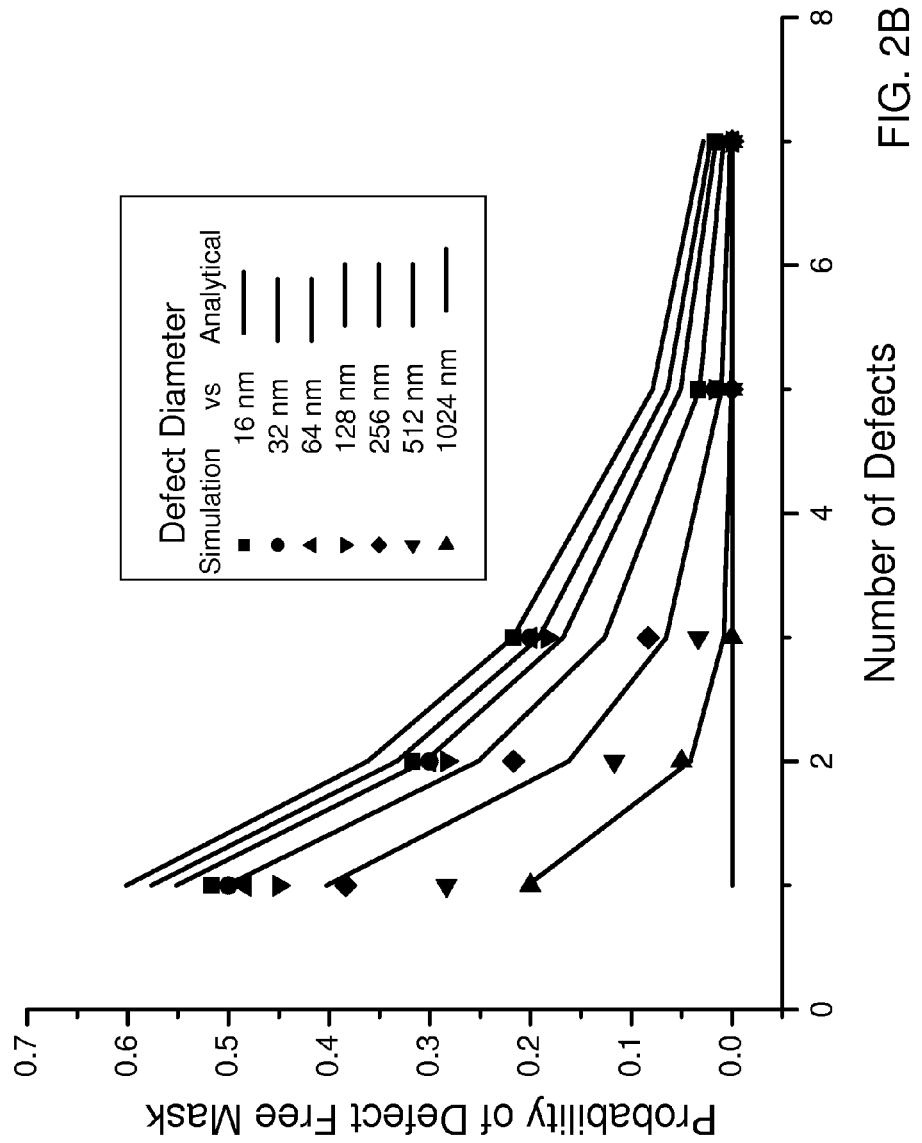
FIG. 2B is a graph illustrating the probability of producing a defect free mask without pattern shifting, as a function of number of defects and defect diameter, for a 65 nm node metal line level mask having 39.8% reflective areas. The points represent the results of Monte Carlo simulations, while the solid lines are analytical calculations derived from Eq. (5).
Figure 3A:
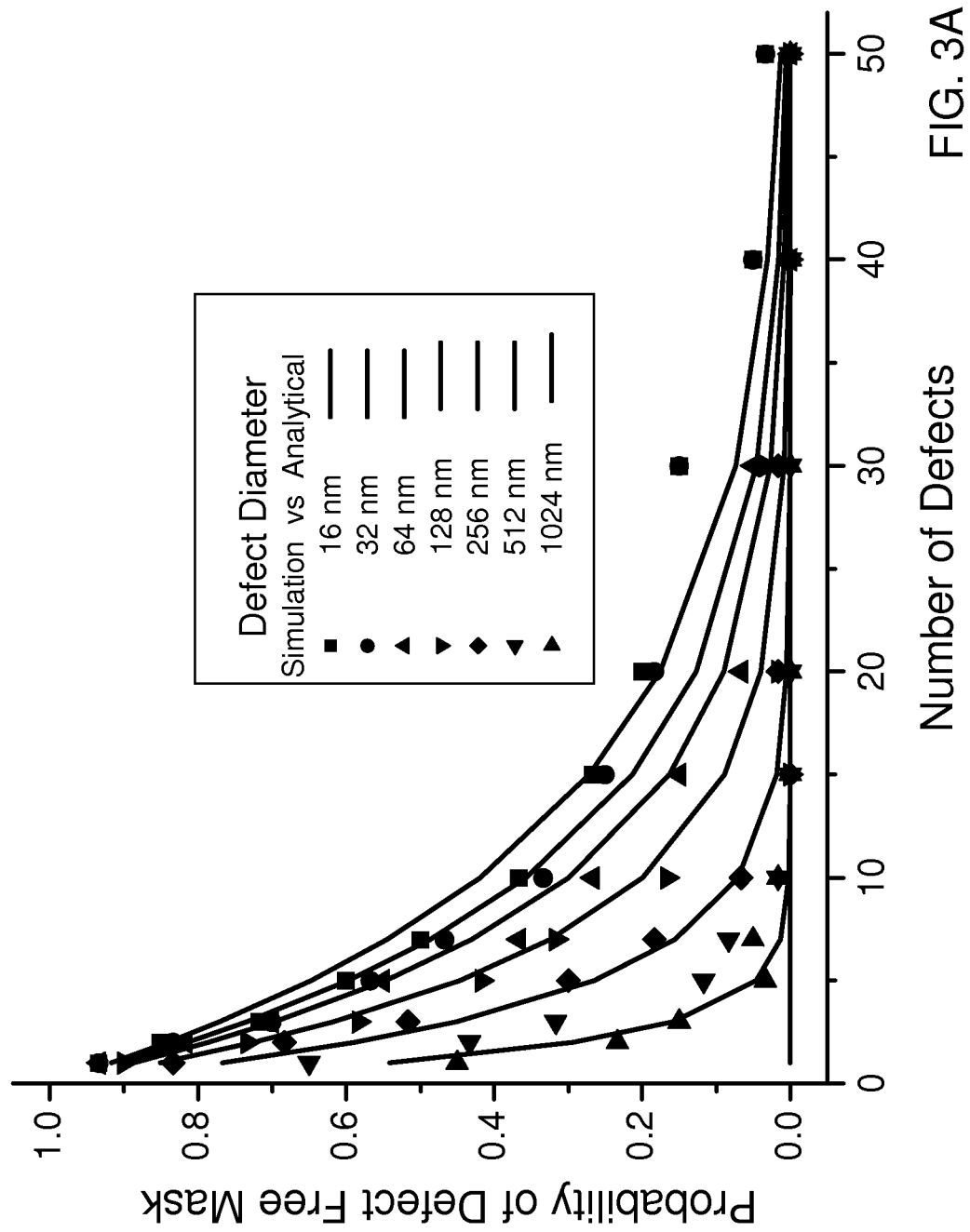
FIG. 3A is a graph illustrating the probability of producing a defect free mask without pattern shifting, as a function of number of defects and defect diameter, for a 45 nm node contact level mask having 8.3% reflective areas. The points represent the results of Monte Carlo simulations, while the solid lines are analytical calculations derived from Eq. (5).
Figure 3B:
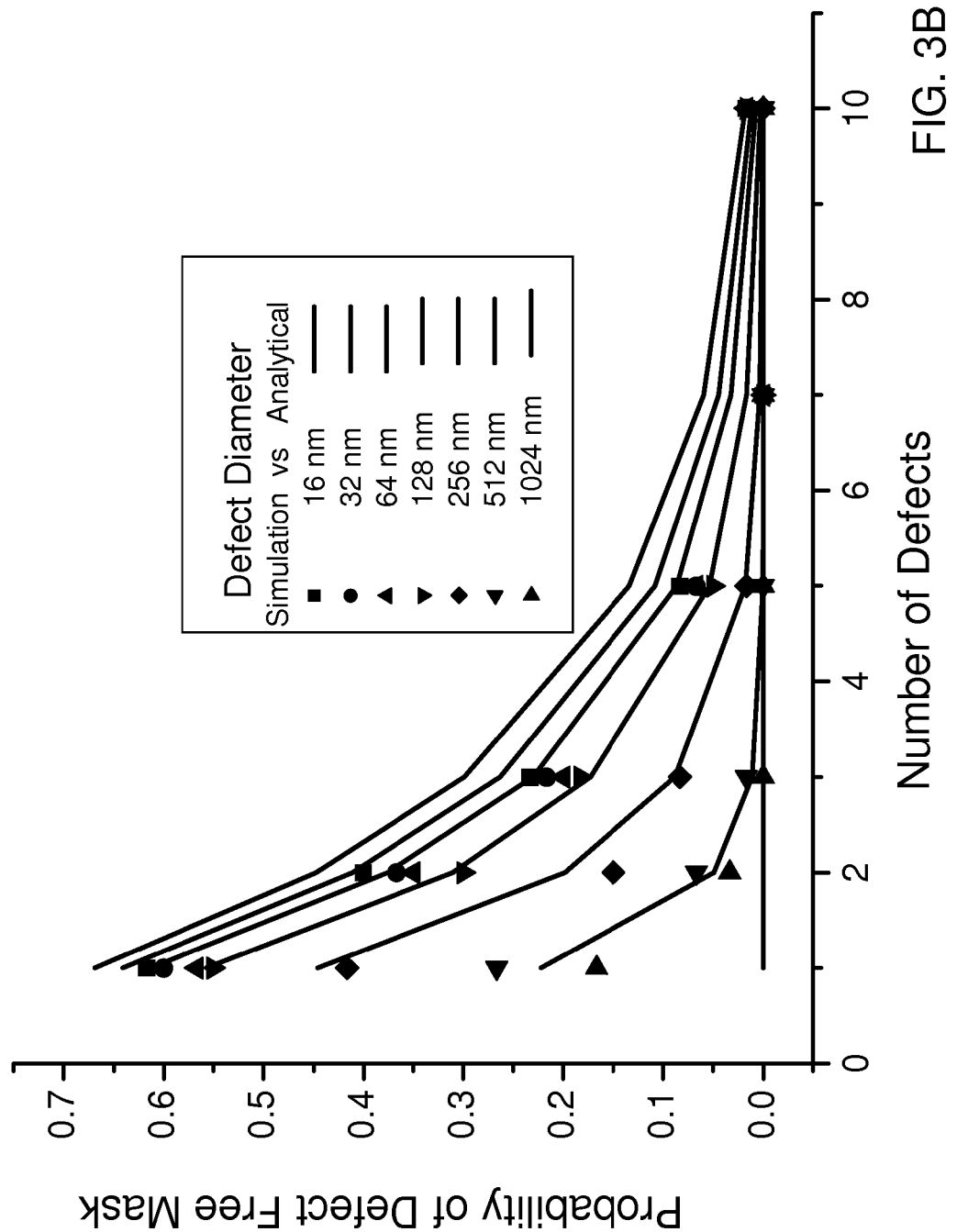
FIG. 3B is a graph illustrating the probability of producing a defect free mask without pattern shifting, as a function of number of defects and defect diameter, for a 45 nm node metal line level mask having 33.1% reflective areas. The points represent the results of Monte Carlo simulations, while the solid lines are analytical calculations derived from Eq. (5).

For a particular technology node, X can be approximated by a single fixed number, and Ar can be determined from the actual mask design. Thus Eq. (5) has no adjustable parameters allowing quantitative predictions to be easily calculated. The solid lines in FIGS. 2A and 2B, show the probability of fabricating a defect free mask for 65 nm photomask designs calculated using Eq. (5). The solid lines in FIGS. 3A and 3B show the probability of fabricating a defect free mask for 45 nm photomask designs calculated using Eq. (5). The graphs in FIGS. 2A and 3A represent exemplary product designs for contact levels. The graphs in FIGS. 2A and 3A represent exemplary product designs for metal line levels.

The mask yield (i.e., the probability of obtaining a usable mask free of deleterious effects of defects) versus number of defects is plotted in FIGS. 2A, 2B, 3A, and 3B for circular defects ranging in size from 16 nm to 1,024 nm. The accuracy of Eq. (5) was tested by comparing it to Monte Carlo simulations using the same product designs. "N" defects of diameter "D" were randomly placed on the mask pattern. If no portion of any defect intercepted a reflective mask feature (e.g. a contact hole), then the mask was deemed perfect. This process was repeated hundreds of times to build up adequate statistics.

The probability of obtaining a defect free mask given a blank with "N" defects of diameter "D" is simply equal to the number of masks deemed perfect divided by the number of attempts. This process was then repeated for numerous values of "N" and "D". The result of these Monte Carlo simulations is the probability of generating a defect free mask as a function of the number and size of the defects, shown as the data points in FIGS. 2A, 2B, 3A, and 3B.

Although common details included in any real design, such as scatter bars, optical proximity correction shapes, contact bars, fill shapes, etc., have not been shown, the simple model represented by Eq. (5) agreed with the Monte Carlo simulations shown in FIGS. 2A, 2B, 3A, and 3B.

These results highlight two important trends. A first trend is that mask yield declines rapidly as the number and size of the defects increase. A second trend is that the fractional reflective area of the mask is an important parameter affecting mask yield as can be seen by comparing FIGS. 2A and 2B with FIGS. 2B and 3B. Yields decrease significantly as the average reflective area increases. These general trends are also present even when pattern shifting is used to mitigate mask blank defects.

If mask patterns are written without regard to the location of blank defects, the mask yield will be poor even for very modest defect densities in the EUV mask blank. A method of placing the mask pattern in an optimal location to avoid blank defects is now described.

Since the defects in any one mask blank are fixed in location, one approach to finding the optimal placement of the photomask pattern is to exhaustively search all possible pattern placements. This can be done by selecting a location on the blank for the mask pattern, and then stepping the pattern in small increments (e.g. ~1 nm) in X and Y to determine if any XY location exists which will "hide" all of the blank defects under the EUV absorber.

According to an embodiment of the present disclosure, a faster and simpler approach based on image processing concepts is disclosed. In a first step of this method, the mask pattern is first assumed to be centrally placed on the mask blank.

Figure 4:
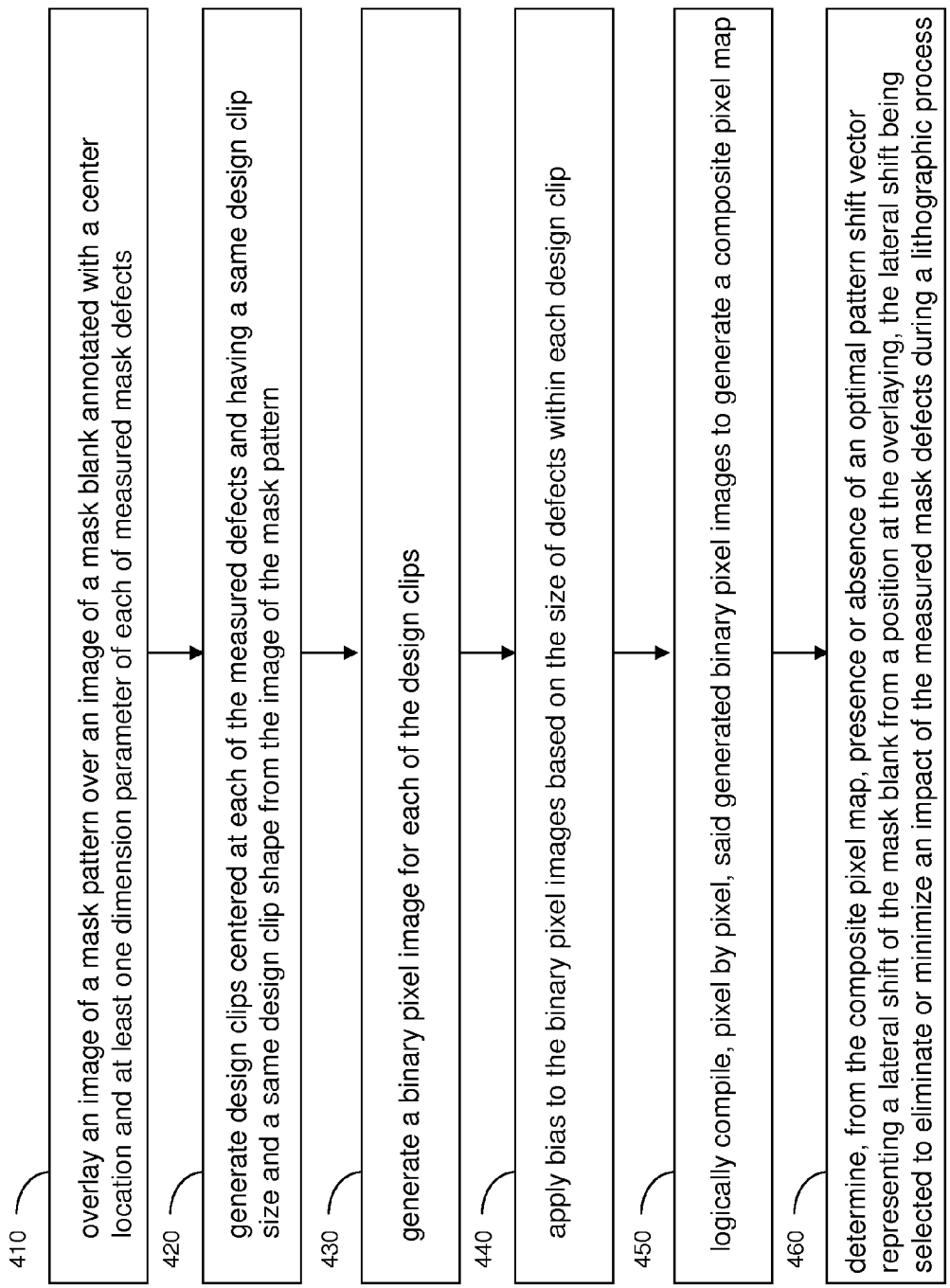
FIG. 4 is a flow chart illustrating a method of determining the presence or absence of an optimal shift vector according to an embodiment of the present disclosure.

FIG. 4 illustrates a method of determining the presence or absence of a pattern shift vector (or a "shift vector" for short), and if present, identifying at least one shift vector. Further, an optimal shift vector can be selected among the at least one shift vector. In one embodiment, the various steps of FIG. 4 can be implemented by a first method. FIGS. 4A-4E schematically illustrates the relations among various elements according to the first method for determining optimal placement of a mask pattern with respect to a mask blank by determining the optimal pattern shift vector V. The optimal pattern shift vector V can be employed to shift the pattern to be printed on a mask blank to "hide" all of the defects in the mask blank under the EUV absorber layer, i.e., to place all of the defects in the mask blank under the EUV absorber layer so that the defects do not generate any deleterious effect during use of the patterned mask generated from the mask blank.

In the first method, design clips centered on each of measured defects are obtained, and the features within each design clip is biased by at least one dimension reflecting the size of the defect. The design clips are converted into a binary file including image pixels having a value of 1 or 0, and logically compiled, pixel by pixel, to generate a composite pixel map. An optimal pattern shift vector V that can be employed to shift the image of the mask pattern can be generated by analysis of the composite pixel map. For example, by shifting the image of the mask pattern by the shift vector V, all of the measured defects can be "hidden" under the EUV absorber of a patterned EUV mask.

Figure 4A:
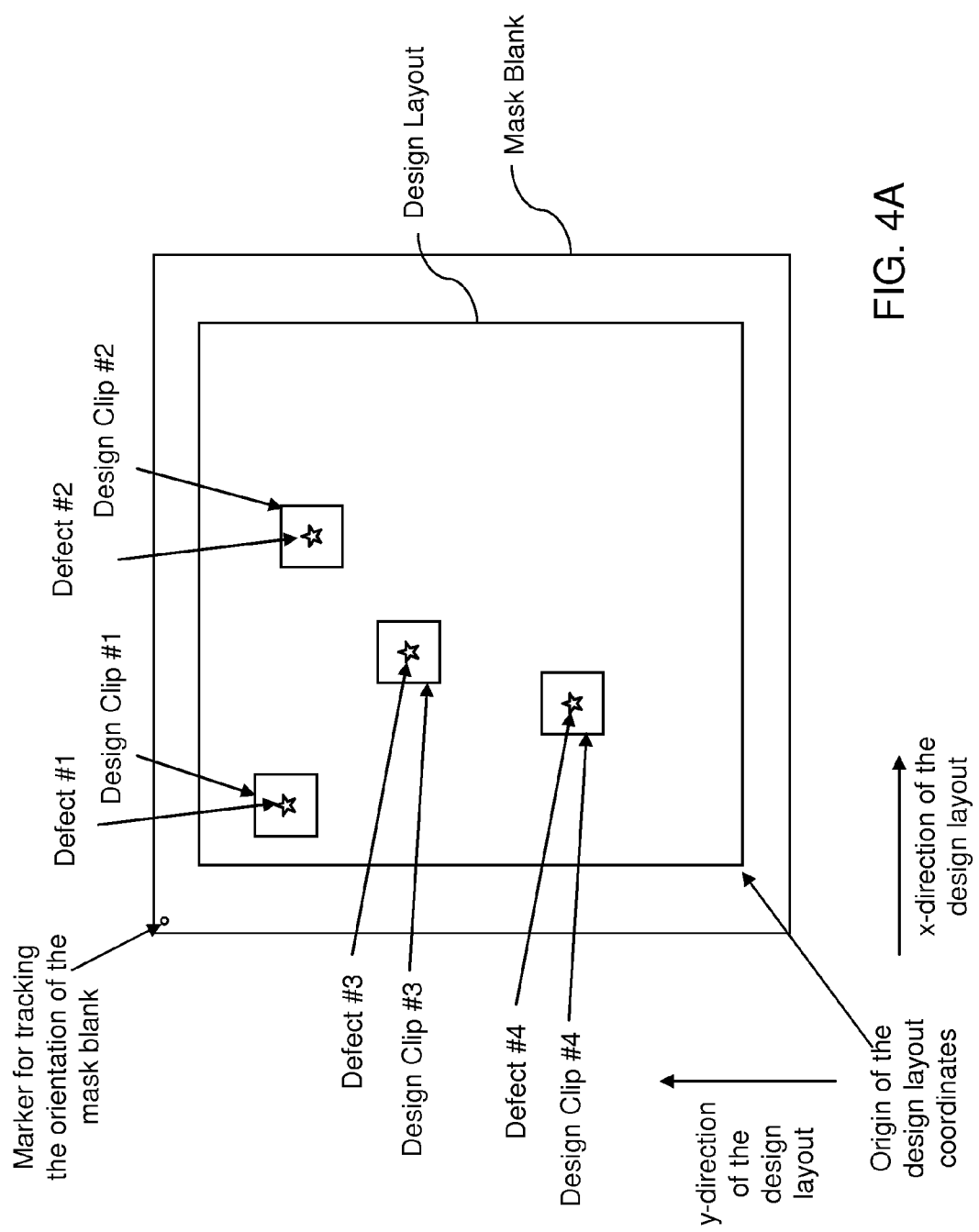
FIG. 4A is an illustration in which the area of a design layout is overlaid over the area of a mask blank including N defects, and design clips centered at each center of defects have been generated from the design layout according to an embodiment of the present disclosure.

Referring to step 410 of FIG. 4 and FIG. 4A, the area of a design layout is overlaid over the area of a mask blank including N measured defects, which can be measured mask defects. The design layout includes a mask pattern to be subsequently formed on the mask blank. The image of the mask blank is annotated with a center location and at least one dimension parameter of the N measured mask defects. The coordinates of the center of each measured defects can be obtained from a mask inspection tool configured to detect defects having a size above a threshold size (not shown). The at least one dimension parameter of the N measured mask defects can include a first lateral dimension "a" along one direction (e.g., an x-direction) and a second lateral dimension "b" along another direction (e.g., y-direction) for each of the N measured mask defects. Each of the at least one dimension parameter of the N measured mask defects can be generated by the mask inspection tool. Thus, the image of the mask pattern embodying the design layout is overlaid over the image of the mask blank annotated with the center location and at least one dimension parameter of each of the measured mask defects.

The overlaying of the area of the design layout over the area of the mask blank can be performed, for example, employing a computing means such as a computer or any other portable or non-portable computing device. The computing means includes a processor and a memory in communication with the processor and is configured to accept as an input a set of data representing the design layout, the size of the mask blank, the location of the N defects on the mask blank, and the orientation of the design layout with respect to the orientation of the mask blank. For example, as shown in FIG. 4A, a marker tracking the orientation of the mask blank can be present at a corner of the area of the mask blank. The marker can be physically present on the mask blank or can be artificially attributed to the mask blank after the data representing the area of the mask blank is loaded into the computing means.

Referring to step 420 of FIG. 4 and FIG. 4A, design clips centered at each center of measured defects are generated from the design layout. Specifically, the design clips are generated such that each design clip is substantially centered at a center point of one of the measured defects. The design clips generated from the image of the mask pattern have a same design clip size, a same design clip shape, and a same orientation for the design clip shape.

The design clip size and the design clip shape are selected so that a magnitude of any vector from a geometrical center of a measured defect to any point on a periphery of a design clip including the measured defect is less than a maximum allowable movement of the image the mask pattern relative to the mask blank along a direction of the vector. The geometrical center of each design clip coincides with the center of the corresponding measured defect, i.e., the defect overlying that design clip. Thus, if the mask pattern were to be moved along a vector starting from the geometrical center of a design clip and ending at any point within the design clip, the entirety of the mask pattern would still remain on the mask blank.

In one embodiment, the same design clip shape can be a rectangular shape having a first set of sides that is parallel to first edges of shapes (e.g., edges of a via shape or a line shape along an x-direction) within the mask pattern and a second set of sides that is parallel to second edges (e.g., edges of a via shape or a line shape along a y-direction) of shapes within the mask pattern. In one embodiment, the lengths of sides of the rectangular shape can be in a range from 0.5 micron to 200 microns, although lesser and greater lengths can also be employed. In another embodiment, the lengths of sides of the rectangular shape can be in a range from 5 microns to 20 microns.

The size of the design clips can be selected to encompass the fully allowable region over which the mask pattern can be placed. In one embodiment, the maximum size of the design clips can be determined by constraints imposed by a lithography tool to be subsequently employed to mount the patterned mask. In one exemplary embodiment, the size of the design clips was limited to 16 μm on each side for convenience. These "N" design clips include all of the pattern information that is accessible for pattern shifting.

In one embodiment, the mask blank can be an extreme ultraviolet (EUV) mask blank including a blanket EUV absorbing layer. Defect-activating regions can be reflective regions and defect-hiding regions can be absorber regions including a remaining portion of the EUV absorber layer in a patterned mask to be derived from the EUV mask blank.

In another embodiment, the mask blank can be a deep ultraviolet (DUV) mask blank including a blanket opaque layer. Defect-activating regions can be transparent regions and defect-hiding regions can be opaque regions including a remaining portion of the blanket opaque layer in a patterned mask to be derived from the DUV mask blank.

Referring to step 430 of FIG. 4 and FIG. 4B, a binary pixel image is generated for each design clip. FIG. 4B illustrates the first binary pixel image generated for the first design clip. The inset shows the pixels in an arbitrary selected area of the binary pixel image for the first binary design clip. The process of generating a binary pixel image from a design clip is herein referred to as "binarization." During binarization, the design shapes present within a design clip is analyzed to assign different digital values between pixels within an area of a defect-activating region and pixels within an area of a defect-hiding region. Thus, each design clip is represented by a corresponding binary pixel image. For example, the black pixels in the inset can have a value of "0" and the white pixel in the inset can have a value of "1."

In one embodiment, each pixel can have a square shape, and the size of each pixel can be the same as a square in which the length of each side is the same as the unit grid dimension of the design layout for the mask pattern. In another embodiment, each pixel can be a rectangle including multiple squares, in which each of the squares has sides having the length of the unit grid dimension of the design layout for the mask pattern.

In one embodiment, the binary pixel images can be generated by assigning a "1" value to each pixel in the binary pixel images that represents a defect-activating region, and by assigning a "0" value to each pixel in the binary pixel images that represents a defect-hiding region. For example, a "1" value can be assigned to each pixel that represents a reflective region in an EUV patterned mask to be generated, and a "0" value can be assigned to each pixel that represents an absorber region in the EUV patterned mask to be generated. In the illustrative example of FIG. 4B, a value of 1 assigned to the reflective areas (white regions) of the mask pattern, and a value of 0 is assigned to the absorber areas (black regions) of the mask pattern Likewise, a "1" value can be assigned to each pixel that represents a transparent region in a DUV patterned mask to be generated, and a "0" value can be assigned to each pixel that represents an opaque region in the DUV patterned mask to be generated.

In one embodiment, the binary pixel images can be generated by assigning a "0" value to each pixel in the binary pixel images that represents a defect-activating region, and by assigning a "1" value to each pixel in the binary pixel images that represents a defect-hiding region. For example, a "0" value can be assigned to each pixel that represents a reflective region in an EUV patterned mask to be generated, and a "1" value can be assigned to each pixel that represents an absorber region in the EUV patterned mask to be generated Likewise, a "0" value can be assigned to each pixel that represents a transparent region in a DUV patterned mask to be generated, and a "1" value can be assigned to each pixel that represents an opaque region in the DUV patterned mask to be generated.

Referring to step 440 of FIG. 4 and FIG. 4C, each defect-activating region is biased in the binary pixel images to expand the defect-activating regions and to generate a set of biased binary pixel images having a one-to-one correspondence with the N design clips. For example, a design clip can be selected one at a time among the N design clips. The binary pixel image corresponding to the selected design clip is modified by applying at least one lateral bias. Each of the at least one lateral bias is proportional to a lateral dimension of the mask defect of that design clip, i.e., the mask defect within the same area as the selected design clip. Application of the at least one bias expands shapes representing defect-activating regions in a patterned mask. If the design shapes of the design layout represent defect-activating regions, application of the at least one bias expands design shapes. If the design shapes of the design layout represent defect-hiding regions in a patterned mask, i.e., if the shapes representing the defect-activating regions are complements of the design shapes of the design layout, application of the at least one bias shrinks design shapes. After the biasing, each design clip is represented by a corresponding biased binary pixel image.

In one embodiment, the expanding of shapes representing defect-activating regions can be performed by expanding the shapes along a first direction (e.g., x-direction) that is perpendicular to first edges (e.g., edges that run along the y-direction) of the shapes (which can be, for example, shapes for vias or metal lines) that are parallel among one another by a first lateral bias, and by expanding the shapes along a second direction (e.g., y-direction) that is perpendicular to second edges (e.g., edges that run along the x-direction) of the shapes that are parallel among one another and perpendicular to the first edges by a second lateral bias.

In one embodiment, the first lateral bias can be one half of a maximum dimension "a" of the mask defect within the same area as the selected design clip along the first direction (e.g., the x-direction), and the second lateral bias can be one half of a maximum dimension "b" of the mask defect within the same area as the selected design clip along the second direction (e.g., the y-direction). In FIG. 4C, a defect-activating region prior to biasing is represented by a solid rectangle, and a region obtained by biasing the defect-activating region is represented by a dotted line, and the size of the defect is represented by an ellipse having a major axis of "a" and a minor axis of "b". In this illustration, the reflective feature in a design clip is biased outward by an amount equal to the lateral dimensions of the defect in the corresponding design clip. Expansion by an amount equal to a/2 from both edges perpendicular to the direction of the major axis of the first defect causes the area of the defect-activating region to grow by "a" along the direction of the major axis of the first defect, and expansion by an amount equal to b/2 from both edges perpendicular to the direction of the minor axis of the first defect causes the area of the defect-activating region to grow by "b" along the direction of the minor axis of the first defect. The value for "a" and the value for "b" may, or may not, be identical to each other, and can vary from defect to defect. Thus, the size of each measured defect can be characterized by a set of two scalars representing maximum extent of the measured defect along two independent directions (such as the x-direction and the y-direction of a Cartesian coordinate system).

Referring to step 450 of FIG. 4 and FIG. 4D, a first biased binary pixel image representing a first biased design clip is shown. The inset shows the pixels in an arbitrary selected area of the first binary pixel image generated from the first (unbiased) binary design clip. For example, the black pixels in the inset can have a value of "0" and the white pixel in the inset can have a value of "1." Any defect-hiding region in each of the biased binary pixel image represents a location at which the center of the measured defect corresponding to that biased binary pixel image could be placed upon pattern shifting of the mask pattern relative to the mask blank in a manner that completely places the measured defect within a physical structure that hides the defect (such as an absorber of an EUV patterned mask or an opaque layer of a DUV patterned mask, i.e., the physical embodiment of the defect-hiding regions) and without physical placement of any part of the measured defect within a physical structure that activates the defect (such as a reflective region of the EUV patterned mask or a transparent region of the DUV mask, i.e., the physical embodiment of the defect-activating region).

Figure 4E:
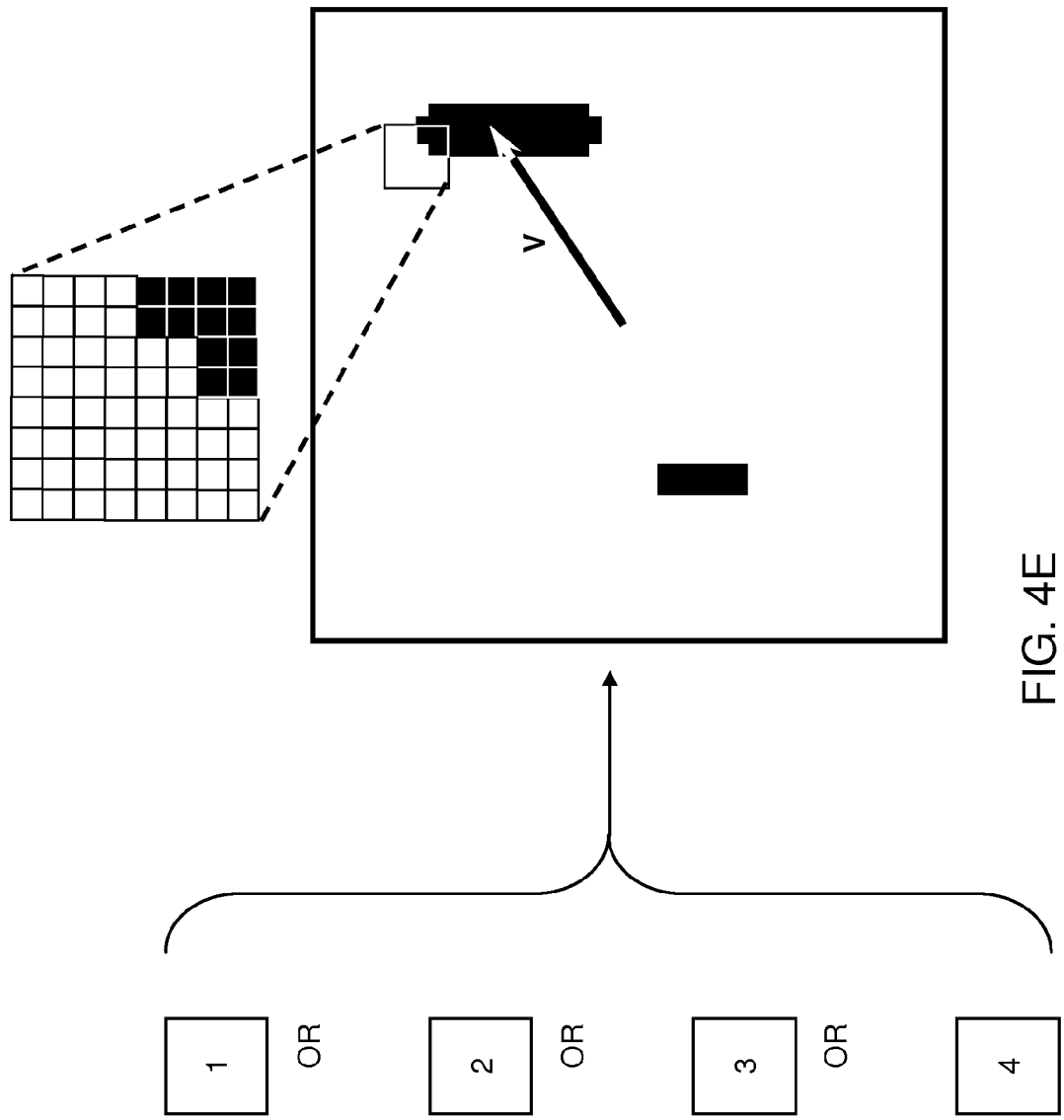
FIG. 4E is an illustration of a composite design clip generated by logically compiling, pixel by pixel, the biased binary pixel images for the N biased design clips according to an embodiment of the present disclosure.

Referring to step 460 of FIG. 4 and FIG. 4E, a composite design clip is generated by logically compiling, pixel by pixel, the generated binary pixel images. The inset shows the pixels in an arbitrary selected area of the composite design clip. As used herein, "logically compiling" or "logical compilation" refers to any logical or mathematical operation on numbers associated with a same pixel location in different images having the same size. All of the biased binary pixel images associated with the design clips have the same size, and each pixel in any biased binary pixel image has (N−1) pixels having the same pixel location among the other (N−1) biased binary pixel images. The composite pixel map representing the composite design clip has the same number of pixels as each of the N biased binary pixel images. For example, the black pixels in the inset can have a value of "0" and the white pixel in the inset can have a value of "1."

In one embodiment, the logical compiling of the biased binary pixel images can be effected by performing a bit-by-bit "OR" operation or a bit-by-bit "AND" operation on all of the N biased binary pixel images. As used herein, an "OR" operation refers to a Boolean OR operation, and an "AND" operation refers to a Boolean AND operation. The value for each pixel in the composite pixel map can be the value derived from the bit-by-bit "OR" operation or the bit-by-bit "AND" operation for all the pixel values for the N pixels located at the same location as the pixel in the composite pixel map.

In one embodiment, a "1" value can be assigned to each pixel in the generated binary pixel images that represents a defect-activating region and a "0" value can be assigned to each pixel in the generated binary pixel images that represents a defect-hiding region during the generating of the binary pixel images. In this case, the logically compiling of the biased binary pixel images can be effected by performing a bit-by-bit "OR" operation on the N biased binary pixel images.

Performing a logical "OR" operation on all of the biased design clips (which are in the form of the biased binary pixel images) can generate the composite pixel map as illustrated in FIG. 4E. In this case, any pixel in the composite pixel map corresponding to a set of N pixels in the biased binary pixel images located at the same pixel location and having the value of "0" has a value of "0." All other pixels in the composite pixel map have a value of "1." In this case, the process of identifying at least one pattern shift vector can include identifying at least one pixel having a "0" value from the composite pixel map.

In the composite pixel map of FIG. 4E, the black regions represent all of the possible end points for a shift vector having a starting point in the middle of the composite pixel map that could be applied to the mask blank with respect to the mask pattern to eliminate or minimize the optically deleterious effect of the N measured defects. Any of these shift vectors can be employed to "hide" the N measured defects, i.e., to mitigate the impact of the N measured defects. Specifically, if the mask blank were to be moved with respect to the mask pattern by any shift vector having the starting point at the center of the composite pixel map and having an ending point anywhere in the black region, all of the N measured defects will fall under a defect-hiding structure such as an EUV absorber in an EUV patterned mask or an opaque film in a DUV mask. Any shift vector from the center of the composite pixel map to any black region represents an acceptable pattern shift, which can be applied to the mask blank as aligned to the mask pattern at the step of FIG. 4A and produce an effectively defect free mask.

If any pixel having a value of "0" is present after the logical "OR" operation on all of the biased design chips, at lease one shift vector is present in the composite pixel map. If at least one shift vector is present, an optimal pattern shift vector can be subsequently determined.

If the composite pixel map includes a single pixel only or a plurality of isolated pixels only as pixels representing possible end points of a shift vector, i.e., pixel clusters representing a minimum of "0" in pixel values of the composite pixel map, any of the single pixel or a plurality of isolated pixels can be identified as the end point of an optimal pattern shift vector V.

If the composite pixel map includes at least one pixel cluster, i.e., a cluster of pixels that are adjoined to one another, but if no pixel would be left if all peripheral pixels (i.e., pixels adjoining any other pixel that does not belong to the pixel cluster) were to be removed from each of the at least one pixel cluster, the optimal shift vector V can be obtained by selecting a pixel cluster having the most number of pixels, and then subsequently determining a geometrical center of all the pixels of the within that pixel cluster, and then selecting the pixel closest to the geometrical center.

If the composite pixel map includes at least one pixel cluster, and if at least one pixel would be left if all peripheral pixels were to be removed from each of the at least one pixel cluster, the optimal shift vector V can be obtained by iteratively removing outermost peripheral pixels from pixel clusters until a last remnant of the pixel clusters has a width not greater than two pixels; and selecting a center point of a composite pixel map including the last remnant as the beginning point of the optimal pattern shift vector V and selecting a point of among the last remnant as the end point of the optimal pattern shift vector V. In case a cluster of many pixels are present, the selection method above ensures that each measured defect is placed as far away from a boundary between a defect-hiding structure and a defect-activating structure and well into the defect-hiding structure.

If the composite pixel map does not include any pixel as pixels representing possible end points of a shift vector, i.e., pixel clusters representing a minimum of "0" in pixel values of the composite pixel map, the absence of an optimal pattern shift vector V is demonstrated that would hide all defects in a patterned mask manufactured with the same relative orientation between the mask blank and the mask pattern as the relative orientation.

Thus, the presence or absence of an optimal pattern shift vector representing a lateral shift of the mask blank from a position at the overlaying at the step of FIG. 4A can be determined from the composite pixel map. The lateral shift is selected to eliminate or minimize an impact of the measured mask defects during a lithographic process. The information on the optimal pattern shift vector can be stored in any non-transitory machine readable medium as known in the art, which include, but is not limited to, a hard drive, a flash memory, a magnetic memory, a portable memory device such as a DVD or a CD, a RAM memory, and a ROM memory.

If an optimal pattern shift vector V can be found employing the method of generating the composite pixel map employing the bit-by-bit "OR" operation, all of the measured defects can be placed under a defect-hiding structure such as an absorber pattern, thereby eliminating or minimizing the effect of the presence of the measured defects. Relative shifting of the mask blank and the mask pattern by the optimal pattern shift vector V eliminates or minimizes the interaction of the measured defects with the defect-activating regions of the lithographic mask, thereby minimizing the deleterious effect of the measured defects.

In another embodiment, a "0" value can be assigned to each pixel in the generated binary pixel images that represents a defect-activating region and a "1" value can be assigned to each pixel in the generated binary pixel images that represents a defect-hiding region during the generating of the binary pixel images. In this case, the logically compiling of the biased binary pixel images can be effected by performing a bit-by-bit "AND" operation on the N biased binary pixel images.

Performing a logical "AND" operation on all of the biased design clips (which are in the form of the biased binary pixel images) can generate the composite pixel map. In this case, any pixel in the composite pixel map corresponding to a set of N pixels in the biased binary pixel images located at the same pixel location and having the value of "1" has a value of "1." All other pixels in the composite pixel map have a value of "0." In this case, the process of identifying the optimal pattern shift vector can include identifying at least one pixel having a "1" value from the composite pixel map.

If any pixel having a value of "1" is present after the logical "AND" operation on all of the biased design chips, at least one shift vector is present in the composite pixel map. If at least one shift vector is present, an optimal pattern shift vector can be subsequently determined.

If the composite pixel map includes a single pixel only or a plurality of isolated pixels only as pixels representing possible end points of a shift vector, i.e., pixel clusters representing a maximum of "1" in pixel values of the composite pixel map, any of the single pixel or a plurality of isolated pixels can be identified as the end point of an optimal pattern shift vector V.

If the composite pixel map includes at least one pixel cluster, i.e., a cluster of pixels that are adjoined to one another, but if no pixel would be left if all peripheral pixels (i.e., pixels adjoining any other pixel that does not belong to the pixel cluster) were to be removed from each of the at least one pixel cluster, the optimal shift vector V can be obtained by selecting a pixel cluster having the most number of pixels, and then subsequently determining a geometrical center of all the pixels of the within that pixel cluster, and then selecting the pixel closest to the geometrical center.

If the composite pixel map includes at least one pixel cluster, and if at least one pixel would be left if all peripheral pixels were to be removed from each of the at least one pixel cluster, the optimal shift vector V can be obtained by iteratively removing outermost peripheral pixels from pixel clusters until a last remnant of the pixel clusters has a width not greater than two pixels; and selecting a center point of a composite pixel map including the last remnant as the beginning point of the optimal pattern shift vector V and selecting a point of among the last remnant as the end point of the optimal pattern shift vector V. In case a cluster of many pixels are present, the selection method above ensures that each measured defect is placed as far away from a boundary between a defect-hiding structure and a defect-activating structure and well into the defect-hiding structure.

If the composite pixel map does not include any pixel as pixels representing possible end points of a shift vector, i.e., pixel clusters representing a maximum of "1" in pixel values of the composite pixel map, the absence of an optimal pattern shift vector V is demonstrated that would hide all defects in a patterned mask manufactured with the same relative orientation between the mask blank and the mask pattern as the relative orientation.

Thus, the presence or absence of an optimal pattern shift vector representing a lateral shift of the mask blank from a position at the overlaying at the step of FIG. 4A can be determined from the composite pixel map. The lateral shift is selected to eliminate or minimize an impact of the measured mask defects during a lithographic process. The information on the optimal pattern shift vector can be stored in any non-transitory machine readable medium as known in the art, which include, but is not limited to, a hard drive, a flash memory, a magnetic memory, a portable memory device such as a DVD or a CD.

If an optimal pattern shift vector V can be found employing the method of generating the composite pixel map employing the bit-by-bit "AND" operation, all of the measured defects can be placed under a defect-hiding structure such as an absorber pattern, thereby eliminating or minimizing the effect of the presence of the measured defects. Relative shifting of the mask blank and the mask pattern by the optimal pattern shift vector V eliminates or minimizes the interaction of the measured defects with the defect-activating regions of the lithographic mask, thereby minimizing the deleterious effect of the measured defects.

In one embodiment, the optimal pattern shift corresponds to a vector to the center of the largest pixel cluster representing a minimum or a maximum (depending on the method of assigning pixel values for the defect-hiding regions and defect-activating regions) in pixel values of the composite pixel map This can be easily determined by iteratively eroding peripheries of the largest pixel cluster one pixel at a time until additional eroding would remove all pixels in the pixel cluster. The vector from the center of the composite pixel map to one of the last remaining pixels is then the optimal pattern shift vector V. For a mask blank containing ~60 defects, the entire image manipulation process of biasing, logical compiling, and eroding typically can be done using a laptop computer in under 1 minute, i.e. ~1 second per defect.

The method illustrated in FIG. 4 can be implemented employing a second method according to a second embodiment. In this embodiment, a composite design clip is generated by performing numerical addition of bit values on N biased design clips. FIGS. 4A-4D and 4F illustrate a second method for determining optimal placement of a mask pattern with respect to a mask blank by determining the optimal pattern shift vector V. Thus, in the second method, the exemplary composite design clip of FIG. 4F can be employed in lieu of the exemplary composite design clip of FIG. 4E.

In the second method, the biased binary pixel images as generated in the step of FIG. 4D are logically compiled, pixel by pixel, to generate a composite pixel map. The logical compiling includes a bit-by-bit numerical addition operation on the bit values of the N pixels located at the same pixel location among the N biased binary pixel images. Subsequently, presence or absence of an optimal pattern shift vector V representing a lateral shift of the mask blank from a position at the overlaying at the step of FIG. 4A is determined from the composite pixel map. The lateral shift represented by the optimal pattern shift vector V is selected to eliminate or minimize an impact of the measured mask defects during a lithographic process. The information on the optimal pattern shift vector can be stored in any non-transitory machine readable medium known in the art.

In one embodiment, a "1" value can be assigned to each pixel in the generated binary pixel images that represents a defect-activating region and a "0" value can be assigned to each pixel in the generated binary pixel images that represents a defect-hiding region during the generating of the binary pixel images. In this case, the logically compiling of the biased binary pixel images can be effected by performing a bit-by-bit numerical addition operation on the N biased binary pixel images to generate the composite pixel map as a grey-scale map.

Figure 4F:
FIG. 4F is an illustration of a composite design clip generated by performing numerical addition of bit values on N biased design clips according to an embodiment of the present disclosure.

Performing the bit-by-bit numerical addition operation on all of the biased design clips (which are in the form of the biased binary pixel images) can generate the composite pixel map as illustrated in FIG. 4F. In this case, any pixel in the composite pixel map corresponding to a set of N pixels in the biased binary pixel images located at the same pixel location and having the value of "0" has a value of "0." All other pixels in the composite pixel map have a value greater than "0" and not exceeding "N." Thus, the composite pixel map is a grey-scale map having a range between, and including, 0 and N. In this case, the process of identifying the optimal pattern shift vector V can include identifying at least one pixel having a least numerical value $V_{min}$ within the grey-scale map. If any pixel has a "0" value, each of the at least one pixel having the least numerical value $V_{min}$ is a pixel having the "0" value. If no pixel has a "0" value, the least numerical value is greater than "0," i.e., having the value of $V_{min}$. In one embodiment, the values of the grey-scale map can be normalized, for example, by dividing the values obtained by the bit-by-bit numerical addition by N, thereby limiting the range of the normalized grey-scale map between, and including, 0 and 1.

In the composite pixel map of FIG. 4F, the black regions represent all of the possible end points for a shift vector having a starting point in the middle of the composite pixel map that could be applied to the mask blank with respect to the mask pattern to eliminate or minimize the optically deleterious effect of the N measured defects. Specifically, if the mask blank were to be moved with respect to the mask pattern by any shift vector having the starting point at the center of the composite pixel map and having an ending point anywhere in the black region, all of the N measured defects will fall under a defect-hiding structure such as an EUV absorber in an EUV patterned mask or an opaque film in a DUV mask. Any shift vector from the center of the composite pixel map to any black region represents an acceptable pattern shift, which can be applied to the mask blank as aligned to the mask pattern at the step of FIG. 4A and produce an effectively defect free mask.

If the least numerical value $V_{min}$ in the grey-scale composite pixel map is greater than 0, this means that there does not exist a shift vector that could be applied to the mask blank with respect to the mask pattern to hide all of the N measured defects. If the grey-scale composite pixel map is not normalized, the least numerical value $V_{min}$ in the grey-scale composite pixel map corresponds to the minimum number of defects that cannot be hidden provided that the relative orientation of the between the mask blank and the mask pattern remains the same as in FIG. 4A and the size of each design chip cannot be increased. In this case, the optimal shift vector V can be employed to hide $(N-V_{min})$ defects among the N measured defects. In one embodiment, if the size of the design clip can be increased, the steps of FIGS. 4A-4D and 4F can be repeated with an increased size for the N design clips to determine another optimal shift vector that can hide more measured defects can be found.

In case multiple pixels have the least numerical value $V_{min}$, identification of the optimal shift vector V can employ the same method as employed in the first method, i.e., 1) by selecting a pixel cluster having the most number of pixels, then subsequently determining a geometrical center of all the pixels of the within that pixel cluster, and then selecting the pixel closest to the geometrical center, or 2) by iteratively removing outermost peripheral pixels from pixel clusters until a last remnant of the pixel clusters has a width not greater than two pixels, and selecting a center point of a composite pixel map including the last remnant as the beginning point of the optimal pattern shift vector V and selecting a point of among the last remnant as the end point of the optimal pattern shift vector V.

In one embodiment, the optimal pattern shift vector V can be required to be able to hide all measured defects, i.e., the least numerical value $V_{min}$ can be required to be zero. In another embodiment, the optimal pattern shift vector V can be allowed to hide less than all measured defects, i.e., the least numerical value $V_{min}$ can be allowed to be greater than zero. In this case, an upper limit on the least numerical value $V_{min}$ can be imposed. The upper limit can be, for example, from 0.01×N to 0.1×N, although lesser and greater upper limits can also be employed.

Once the requirement of the upper limit for the least numerical value $V_{min}$ is set, the presence or absence of an optimal pattern shift vector representing a lateral shift of the mask blank from a position at the overlaying at the step of FIG. 4A can be determined from the composite pixel map. The lateral shift is selected to eliminate or minimize an impact of the measured mask defects during a lithographic process. The information on the optimal pattern shift vector can be stored in any non-transitory machine readable medium as known in the art, which include, but is not limited to, a hard drive, a flash memory, a magnetic memory, a portable memory device such as a DVD or a CD.

In another embodiment, a "0" value can be assigned to each pixel in the generated binary pixel images that represents a defect-activating region and a "1" value can be assigned to each pixel in the generated binary pixel images that represents a defect-hiding region during the generating of the binary pixel images. In this case, the logically compiling of the biased binary pixel images can be effected by performing a bit-by-bit numerical addition operation on the N biased binary pixel images to generate the composite pixel map as a grey-scale map.

In this case, any pixel in the composite pixel map corresponding to a set of N pixels in the biased binary pixel images located at the same pixel location and having the value of "1" has a value of "N." All other pixels in the composite pixel map have a value less than "N." Thus, the composite pixel map is a grey-scale map having a range between, and including, 0 and N. In this case, the process of identifying the optimal pattern shift vector V can include identifying at least one pixel having a greatest numerical value $V_{max}$ within the grey-scale map. If any pixel has an "N" value, each of the at least one pixel having the greatest numerical value $V_{max}$ is a pixel having the "N" value. If no pixel has an "N" value, the greatest numerical value is less than "N," i.e., having the value of $V_{max}$. In one embodiment, the values of the grey-scale map can be normalized, for example, by dividing the values obtained by the bit-by-bit numerical addition by N, thereby limiting the range of the normalized grey-scale map between, and including, 0 and 1.

If the greatest numerical value $V_{max}$ in the grey-scale composite pixel map is N, any shift vector from the center of the composite pixel map to a pixel having the value of N represents an acceptable pattern shift, which can be applied to the mask blank as aligned to the mask pattern at the step of FIG. 4A and produce an effectively defect free mask.

If the greatest numerical value $V_{max}$ in the grey-scale composite pixel map (without normalization) is less than N, this means that there does not exist a shift vector that could be applied to the mask blank with respect to the mask pattern to hide all of the N measured defects. If the grey-scale composite pixel map is not normalized, the greatest numerical value $V_{max}$ in the grey-scale composite pixel map corresponds to the maximum number of defects that can be hidden provided that the relative orientation of the between the mask blank and the mask pattern remains the same as in FIG. 4A and the size of each design chip cannot be increased. In this case, the optimal shift vector V can be employed to hide $V_{max}$ defects among the N measured defects. In one embodiment, if the size of the design clip can be increased, the steps of FIGS. 4A-4D and 4F can be repeated with an increased size for the N design clips to determine another optimal shift vector that can hide more measured defects can be found.

In case multiple pixels have the greatest numerical value $V_{max}$, identification of the optimal shift vector V can employ the same method as employed in the first method, i.e., 1) by selecting a pixel cluster having the most number of pixels, then subsequently determining a geometrical center of all the pixels of the within that pixel cluster, and then selecting the pixel closest to the geometrical center, or 2) by iteratively removing outermost peripheral pixels from pixel clusters until a last remnant of the pixel clusters has a width not greater than two pixels, and selecting a center point of a composite pixel map including the last remnant as the beginning point of the optimal pattern shift vector V and selecting a point of among the last remnant as the end point of the optimal pattern shift vector V.

In one embodiment, the optimal pattern shift vector V can be required to be able to hide all measured defects, i.e., the greatest numerical value $V_{max}$ can be required to be N. In another embodiment, the optimal pattern shift vector V can be allowed to hide less than all measured defects, i.e., the greatest numerical value $V_{max}$ can be allowed to be less than N. In this case, a lower limit on the least numerical value $V_{max}$ can be imposed. The lower limit can be, for example, from 0.9×N to 0.99×N, although lesser and greater lower limits can also be employed.

Once the requirement of the lower limit for the greatest numerical value $V_{max}$ is set, the presence or absence of an optimal pattern shift vector representing a lateral shift of the mask blank from a position at the overlaying at the step of FIG. 4A can be determined from the composite pixel map. The lateral shift is selected to eliminate or minimize an impact of the measured mask defects during a lithographic process. The information on the optimal pattern shift vector can be stored in any non-transitory machine readable medium as known in the art, which include, but is not limited to, a hard drive, a flash memory, a magnetic memory, a portable memory device such as a DVD or a CD.

The first method and the second method can be applied not only to EUV lithography and DUV lithography, but to any situation where a pattern is printed on a substrate which contains more or less desirable regions (e.g. good and defective regions on the substrate).

Figure 4G:
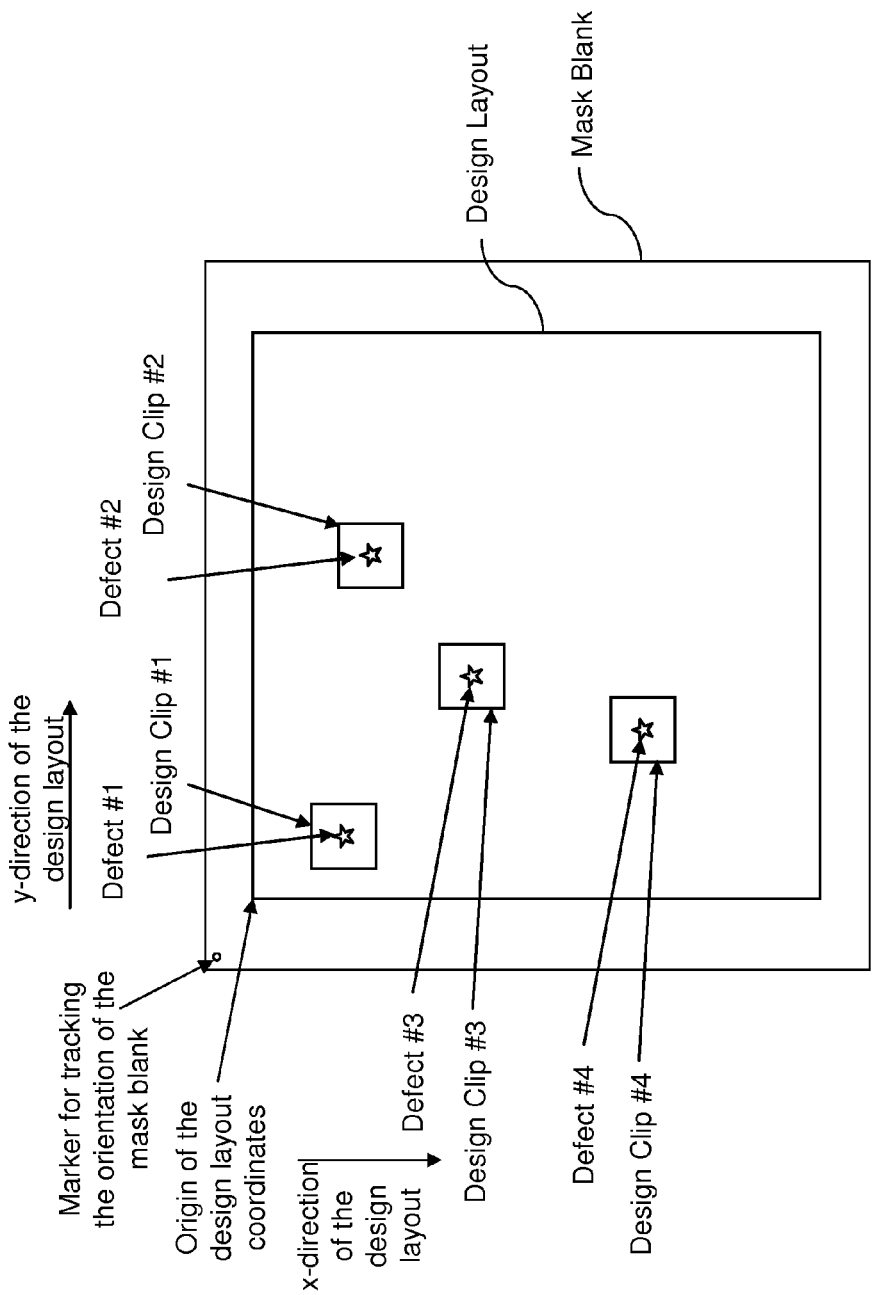
FIG. 4G is an illustration in which the area of a design layout is overlaid over the area of a mask blank including N defects after rotating the design layout by 90 degrees relative to the mask blank, and design clips centered at each center of defects have been generated from the design layout according to an embodiment of the present disclosure.

Referring to FIG. 4G, the first method illustrated in FIGS. 4A-4E or the second method illustrated in FIGS. 4A-4D and 4F can be repeatedly performed after relative rotation of the design layout and the mask blank according to a third method of the present disclosure. In this case, the area of the design layout is overlaid over the area of a mask blank including N defects after rotating the design layout by 90 degrees relative to the mask blank.

The design clips centered at each center of defects are generated from the design layout in the same manner as illustrated in FIG. 4A. Specifically, the design clips in FIG. 4G are generated from the rotated image of the mask pattern as illustrated in FIG. 4G, and have the same design clip size, the same design clip shape, and the same design clip orientation thereamongst. The design clip size of the design clips in FIG. 4G may, or may not, be the same as the design clip size of the design clips in FIG. 4A. Further, design clip shape of the design clips in FIG. 4G may, or may not, be the same as the design clip shape of the design clips in FIG. 4A. Yet further, the design clip orientation of the design clips in FIG. 4G may, or may not, be the same as the design clip orientation of the design clips in FIG. 4A. The differences in the size, shape, and/or orientation among the design clips of FIG. 4A and FIG. 4G can be due to differences in the available margins in the mask blank upon overlaying of a same mask pattern in different orientations.

An additional binary pixel image is generated and biased for each of the additional design clips generated at the step of FIG. 4G employing the same method illustrated in FIGS. 4B-4D. The generated additional binary pixel images are logically compiled, pixel by pixel, to generate an additional composite pixel map. The presence or absence of an additional optimal pattern shift vector representing a lateral shift of the rotated mask pattern from a position at the overlaying of the rotated image as represented in FIG. 4G can be determined from the additional composite pixel map. The lateral shift represented by the additional optimal pattern shift vector is selected to eliminate or minimize an impact of the measured mask defects during a lithographic process. Information on the optimal pattern shift vector and the additional pattern shift vector can be compared to select a pattern shift vector that provides greater suppression of effects of the measured defects.

In one embodiment, pixel clusters representing a minimum or a maximum in pixel values (that correspond to a defect-hiding region) can be present both in the composite pixel map as generated at the step of FIG. 4E or 4F, and in the additional composite pixel map as generated at the step of FIG. 4G. In this embodiment, selection of the pattern shift vector that provides greater suppression of effects of the measured defects is effected by: 1) iteratively removing outermost peripheral pixels from pixel clusters representing a minimum or a maximum in pixel values of the composite pixel map and the additional composite pixel map until a last remnant of the pixel clusters has a width not greater than two pixels, and 2) selecting a center point of a composite pixel map including the last remnant as a beginning point of the selected pattern shift vector and selecting a point of among the last remnant as an end point of the selected pattern shift vector.

Further improvement in the defect limited mask yield beyond the results shown here is also possible by allowing the rotational orientation of the mask blank to include 0, 90, 180, or 270 degrees. This would essentially permit 4 independent pattern shifts to be calculated with selection of the best one. In this case, the rotation angle between the rotated image of the mask pattern and the image of the mask pattern is selected from 90 degrees, 180 degrees, and 270 degrees. Information on the optimal pattern shift vectors generated at various alignment angles between the mask pattern and the mask blank can be compared to select a pattern shift vector that provides greatest suppression of deleterious effects of the measured defects.

Figure 4H:
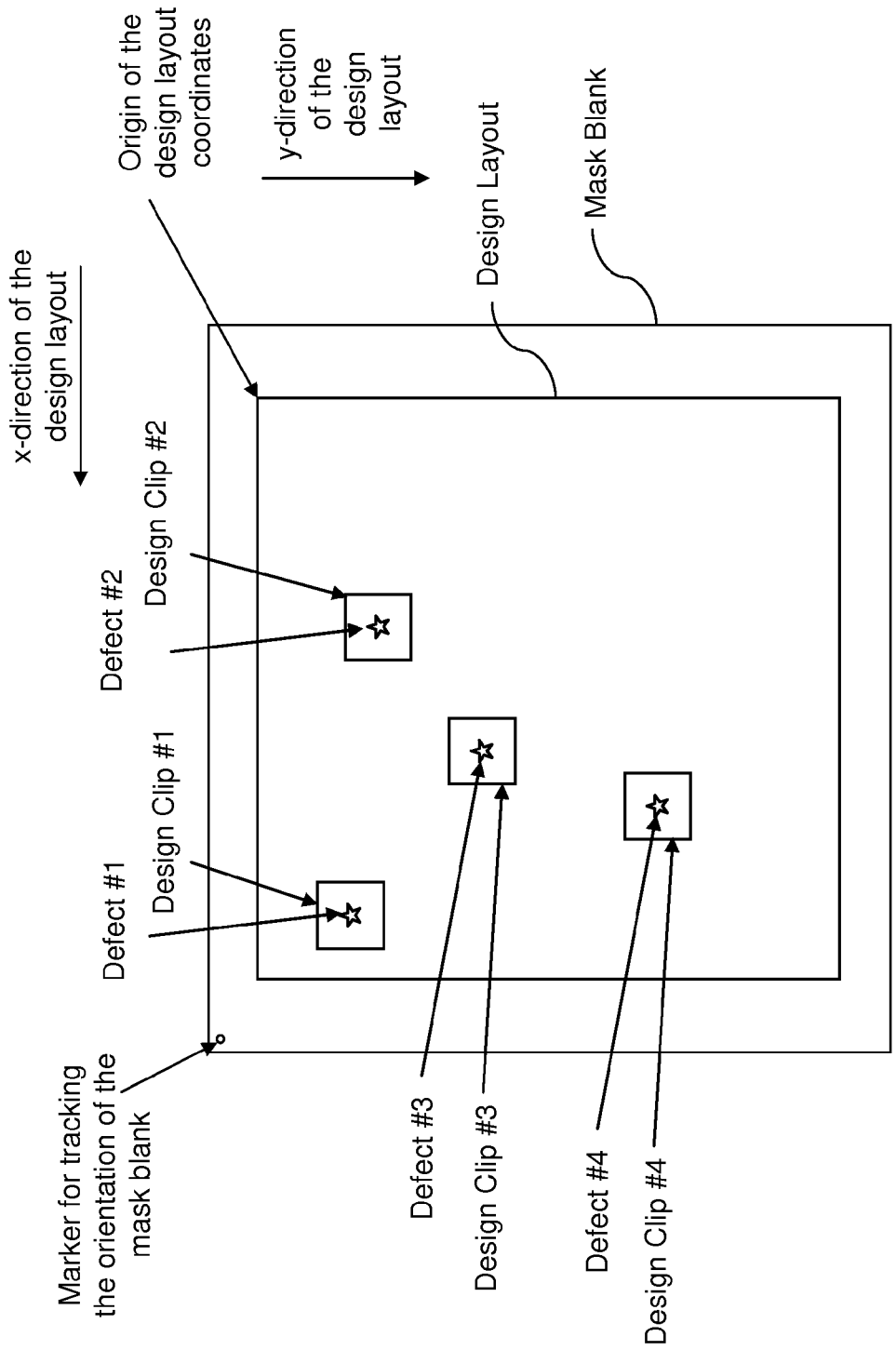
FIG. 4H is an illustration in which the area of a design layout is overlaid over the area of a mask blank including N defects after rotating the design layout by 180 degrees relative to the mask blank, and design clips centered at each center of defects have been generated from the design layout according to an embodiment of the present disclosure.
Figure 4I:
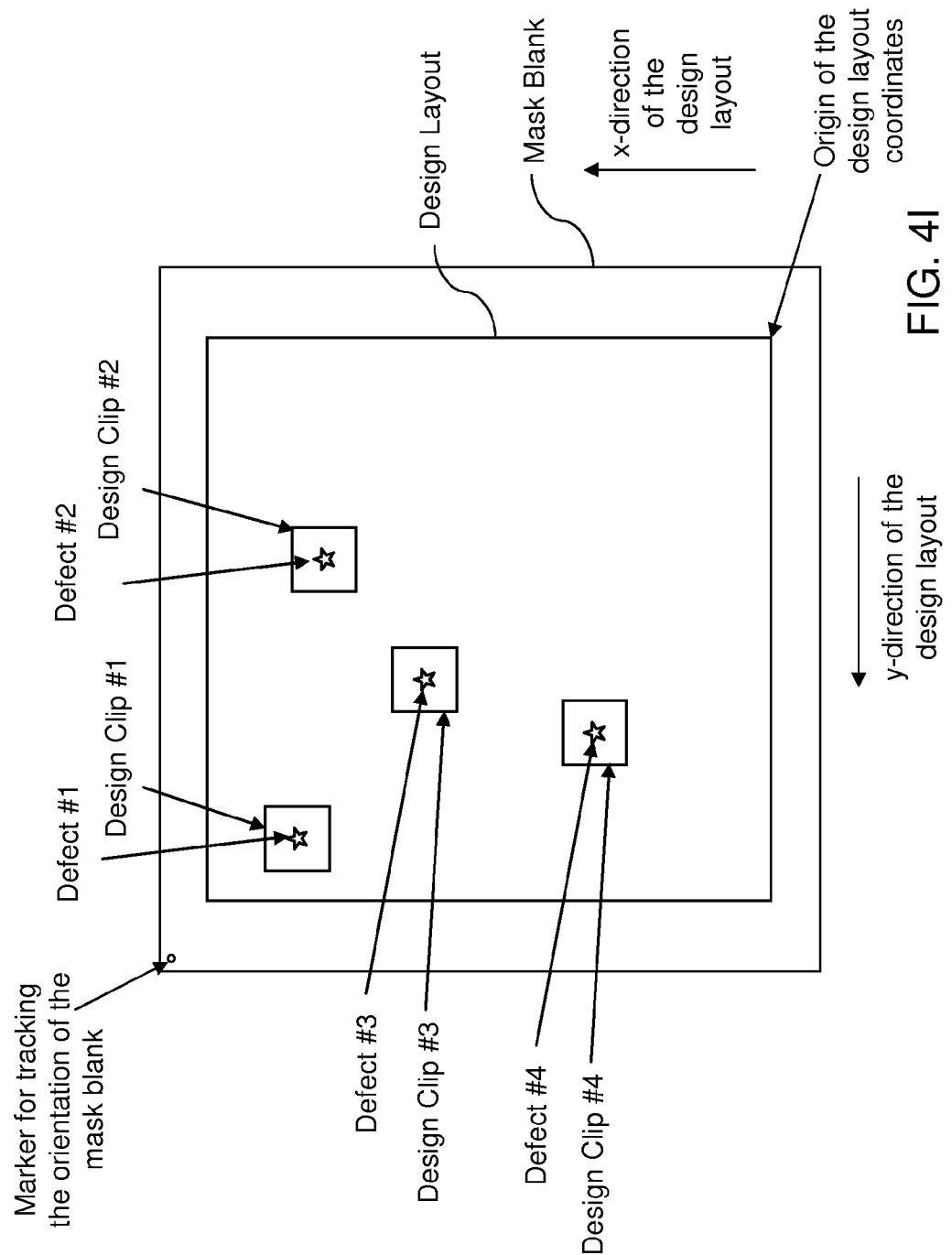
FIG. 4I is an illustration in which the area of a design layout is overlaid over the area of a mask blank including N defects after rotating the design layout by 270 degrees relative to the mask blank, and design clips centered at each center of defects have been generated from the design layout according to an embodiment of the present disclosure.

FIG. 4H is an illustration in which the area of a design layout is overlaid over the area of a mask blank including N defects after rotating the design layout by 180 degrees relative to the mask blank. The third method can be performed with the alignment described in FIG. 4H in lieu of, or in addition to, the third method performed with the alignment described in FIG. 4G. FIG. 4I is an illustration in which the area of a design layout is overlaid over the area of a mask blank including N defects after rotating the design layout by 270 degrees relative to the mask blank. The third method can be performed with the alignment described in FIG. 4I in lieu of, or in addition to, the third method performed with the alignment described in FIG. 4G and/or the third method performed with the alignment described in FIG. 4H.

Referring to FIG. 4J, the first method illustrated in FIGS. 4A-4E or the second method illustrated in FIGS. 4A-4D and 4F can be repeatedly performed, with or without combination with the third method illustrated in FIGS. 4G-4I, after relative rotation of the design layout and the mask blank by an angle $\alpha$ that is not commensurate with $\pi/2$ (i.e., 90 degrees) according to a fourth method of the present disclosure. In this case, the area of the design layout is overlaid over the area of a mask blank including N defects after rotating the design layout by the angle $(\alpha+i\times\pi/2)$ relative to the mask blank, in which i is an integer selected from 0, 1, 2, and 3. The angle $\alpha$ has a magnitude less than $\pi/2$. In one embodiment, the angle $\alpha$ has a range from, and excluding, −90 degrees and +90 degrees and is not equal to 0. In another embodiment, the angle $\alpha$ has a range from, and excluding, −15 degrees and +15 degrees and is not equal to 0. In this case, the rotation angle between the rotated image of the mask pattern and the image of the mask pattern can be selected from a range from −15 degrees to +15 degrees that excludes 0 degrees, a range from 75 degrees to 105 degrees that excludes 90 degrees, a range from 165 degrees to 195 degrees that excludes 180 degrees, and a range from 255 degrees to 285 degrees that excludes 270 degrees.

The design clips centered at each center of defects are generated from the design layout in the same manner as illustrated in FIG. 4A. Specifically, the design clips in FIG. 4J are generated from the rotated image of the mask pattern as illustrated in FIG. 4J, and have the same design clip size, the same design clip shape, and the same design clip orientation thereamongst. The design clip size of the design clips in FIG. 4J may, or may not, be the same as the design clip size of the design clips in FIGS. 4A, 4G, 4H, and 4I. Further, design clip shape of the design clips in FIG. 4J may, or may not, be the same as the design clip shape of the design clips in FIGS. 4A, 4G, 4H, and 4I. Yet further, the design clip orientation of the design clips in FIG. 4J may, or may not, be the same as the design clip orientation of the design clips in FIGS. 4A, 4G, 4H, and 4I. The differences in the size, shape, and/or orientation among the design clips of FIGS. 4A, 4G, 4H, 4I and FIG. 4J can be due to differences in the available margins in the mask blank upon overlaying of a same mask pattern in different orientations. The design clips in FIG. 4J can be generated in lieu or, or in addition to, any set of design clips illustrated in FIGS. 4A, 4G, and/or 4H.

An additional binary pixel image is generated and biased for each of the additional design clips generated at the step of FIG. 4J employing the same method illustrated in FIGS. 4B-4D. The generated additional binary pixel images are logically compiled, pixel by pixel, to generate an additional composite pixel map. The presence or absence of an additional optimal pattern shift vector representing a lateral shift of the rotated mask pattern from a position at the overlaying of the rotated image as represented in FIG. 4J can be determined from the additional composite pixel map. The lateral shift represented by the additional optimal pattern shift vector is selected to eliminate or minimize an impact of the measured mask defects during a lithographic process. Information on the optimal pattern shift vector and the additional pattern shift vector can be compared to select a pattern shift vector that provides greater suppression of effects of the measured defects.

In one embodiment, pixel clusters representing a minimum or a maximum in pixel values (that correspond to a defect-hiding region) can be present both in the composite pixel map as generated at the step of FIG. 4E or 4F, and in the additional composite pixel map as generated at the step of FIG. 4J. In this embodiment, selection of the pattern shift vector that provides greater suppression of effects of the measured defects is effected in the same manner as in the first, second, and third methods.

Further improvement in the defect limited mask yield beyond the methods of the first, second, and third methods is possible by allowing the rotational orientation of the mask blank to include many different rotational angles different from 90 degrees, 180 degrees, and 270 degrees provided that the area of the rotated mask pattern can fit within the area of the mask blank. Further, it is noted that the rotation of the mask blank while keeping the mask pattern stationary has the same effect as the rotation of the mask pattern while keeping the mask blank stationary in the opposite direction and with the same magnitude of angular rotation. The ability to rotate the mask pattern with respect to the mask blank at an arbitrary angle permits an unlimited number of independent pattern shifts to be calculated with selection of the best one. Information on the optimal pattern shift vectors generated at various alignment angles between the mask pattern and the mask blank can be compared to select a pattern shift vector that provides greatest suppression of deleterious effects of the measured defects.

Figure 5:
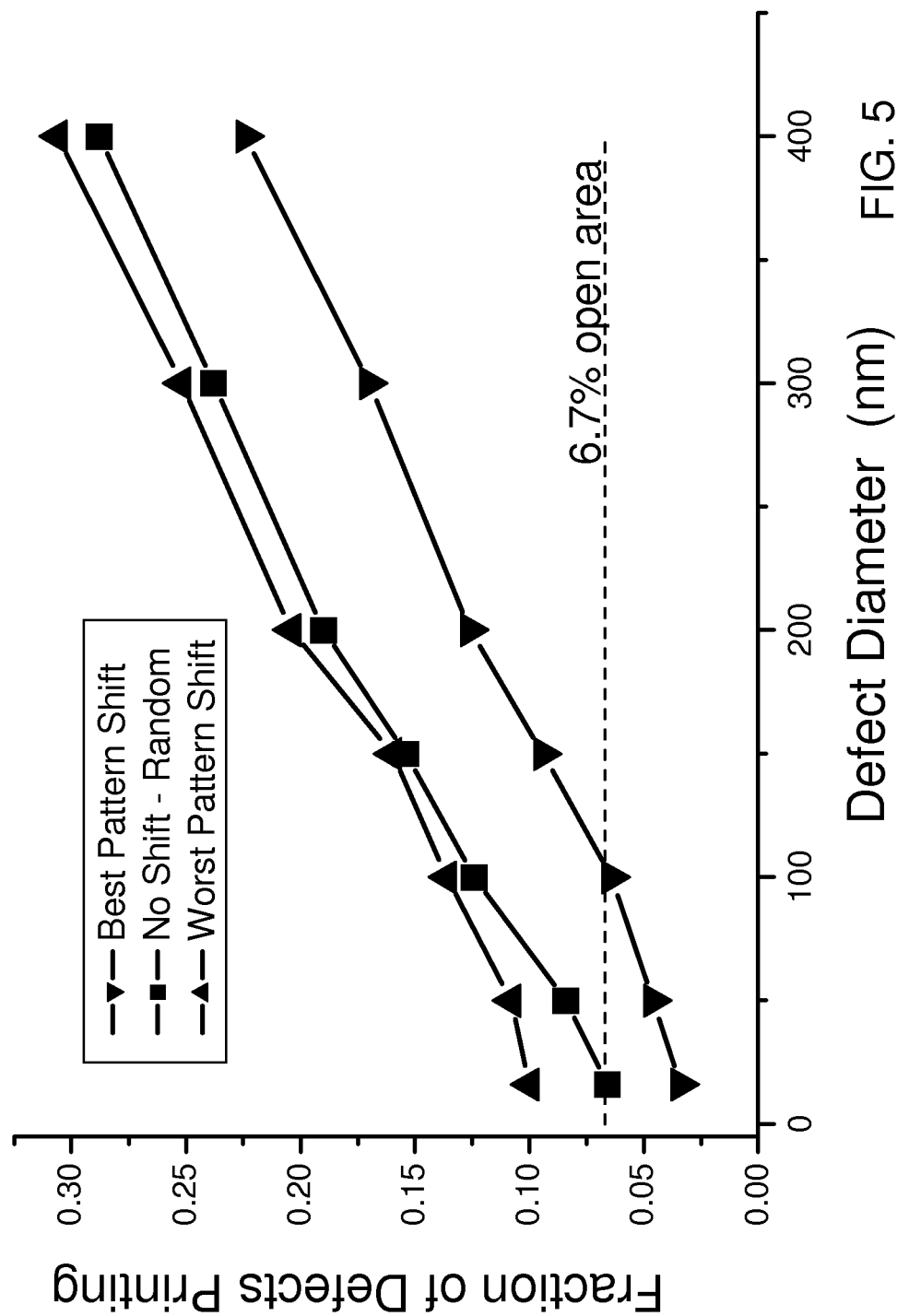
FIG. 5 is a graph illustrating the fraction of defects on a mask blank which will fall inside the printable features on a 45 nm node contact level mask, in the limit of a large number of defects (500) as a function of defect diameter. Results are shown for 3 cases, i) no pattern shift, ii) a worst case pattern shift, and iii) the optimal pattern shift.

Since the time required to compute the optimal pattern shift is small, extensive simulations of mask yield as a function of defect size, number, and shape can be run for typical lithographic mask patterns. An initial assessment of the potential of pattern shifting for a 45 nm node contact level mask is shown in FIG. 5. FIG. 5 shows the fraction of defects on a mask blank which will fall inside the printable features on the 45 nm node contact level mask, in the limit of a large number of defects (500) as a function of defect diameter. A mask blank with 500 defects was simulated and the fraction of these defects that intercepted contact holes (reflective areas) was determined, i.e. the fraction of defects that would print. Three cases were considered: 1) an optimal pattern shift which minimizes the number of printable defects, 2) a worst case pattern shift which maximizes the number of printable defects, and 3) no pattern shift.

The results in FIG. 5 show that a significant decrease in the number of printable defects can be achieved, particularly for small defects, for an optimal pattern shift versus a worst case pattern shift or no pattern shift. This result may seem rather surprising in view of the very large number of defects (500) in the blank. It might be expected that with such a large number of defects, as the pattern is shifted with respect to the blank, as many defects would move into a contact area as would move out of a contact area, thus negating any net benefit of pattern shift. However, it is clear from FIG. 5 that altering the placement of the pattern with respect to the blank can result in as much as a factor of 3 reduction in the number of printable defects. Finally, note that when no pattern shift is employed, the fraction of the smallest defects which reside within a reflective area is approximately equal to the average fractional reflective (open) area (e.g., 6.7%) on the mask as expected.

What is most relevant for EUV mask making is determining not the fraction of defects which will print, but rather if all of the defects in a given blank can be hidden under the EUV absorber. Using the method described in FIGS. 4A-4J, the defect limited mask yield has been determined with and without pattern shifting for various mask levels. A pool of 500 design clips was created by selecting clips at random locations on a photomask pattern. Each of these design clips represented the pattern surrounding a potential blank defect. "N" design clips representing "N" blank defects were then randomly selected from the pool and the optimal pattern shift is determined using the method outlined in FIGS. 4A-4E. Finally, it was determined whether all "N" defects of diameter "D" landed under the EUV absorber, i.e., whether no portion of any defect resided in a printable region of the mask. If none of the "N" defects of diameter "D" intercepted a reflective region of the mask pattern, then the mask was deemed perfect. This process was repeated hundreds of times with and without pattern shift to build up a statistically significant outcome. The probability of obtaining a defect free mask was obtained by determining the number of masks deemed to be perfect divided by the total number of attempts.

Figure 6A:
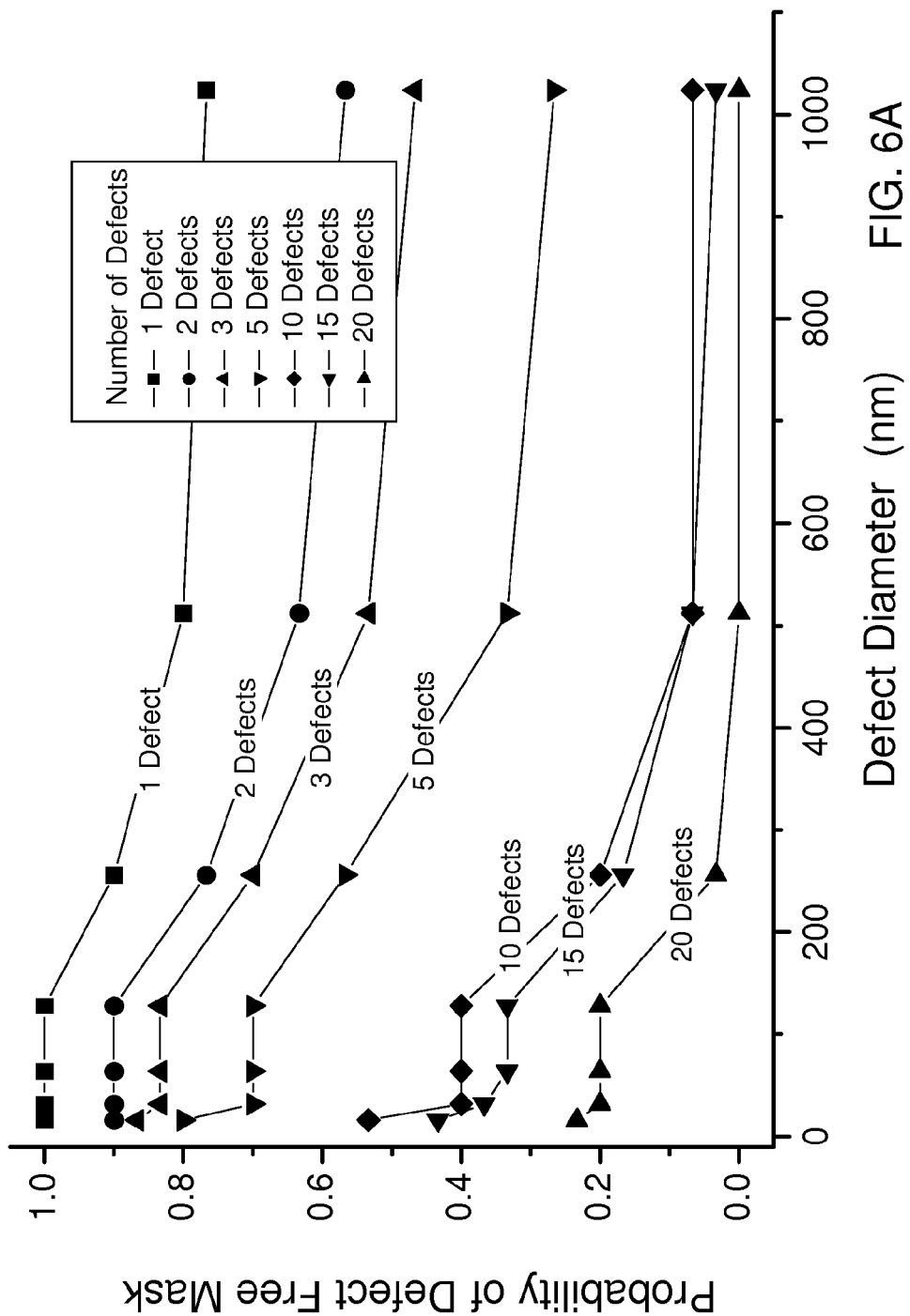
FIG. 6A is a graph illustrating the probability of producing a defect free mask without pattern shifting for a 45 nm node contact level mask pattern with an average reflective (open) area of 5.5%.
Figure 6B:
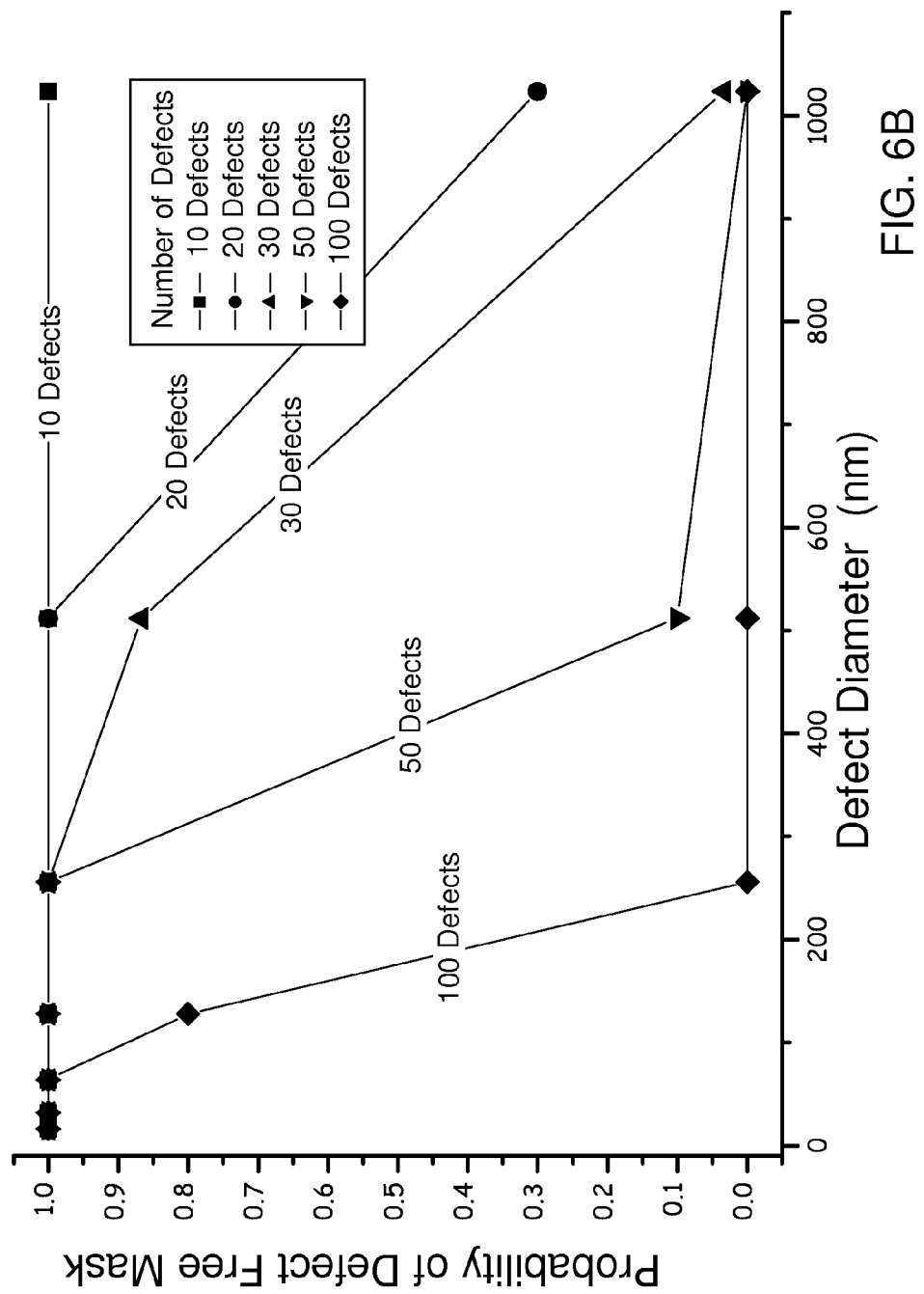
FIG. 6B is a graph illustrating the probability of producing a defect free mask with pattern shifting for the 45 nm node contact level mask pattern employed to generate the graph of FIG. 6A.

FIGS. 6A and 6B show the probability of obtaining a defect free mask versus the number and size of defects for a 45 nm technology node via level mask pattern. In this case, the average reflective area is 5.5%. The yield without pattern shift is shown in FIG. 6A. Even with only 10 defects, the yield is below 50% for small defects, declining rapidly toward zero yield at larger defect sizes. As shown in FIG. 6B, pattern shifting improves the mask yield with 10 defects to 100% even for defects as large as 1000 nm. Yields of 100% are also possible with as many as 100 defects on the order of 100 nm in diameter. The large improvement in mask yield by optimally positioning the via pattern with respect to the mask blank is apparent when compared with the graph of FIG. 6A.

Figure 7A:
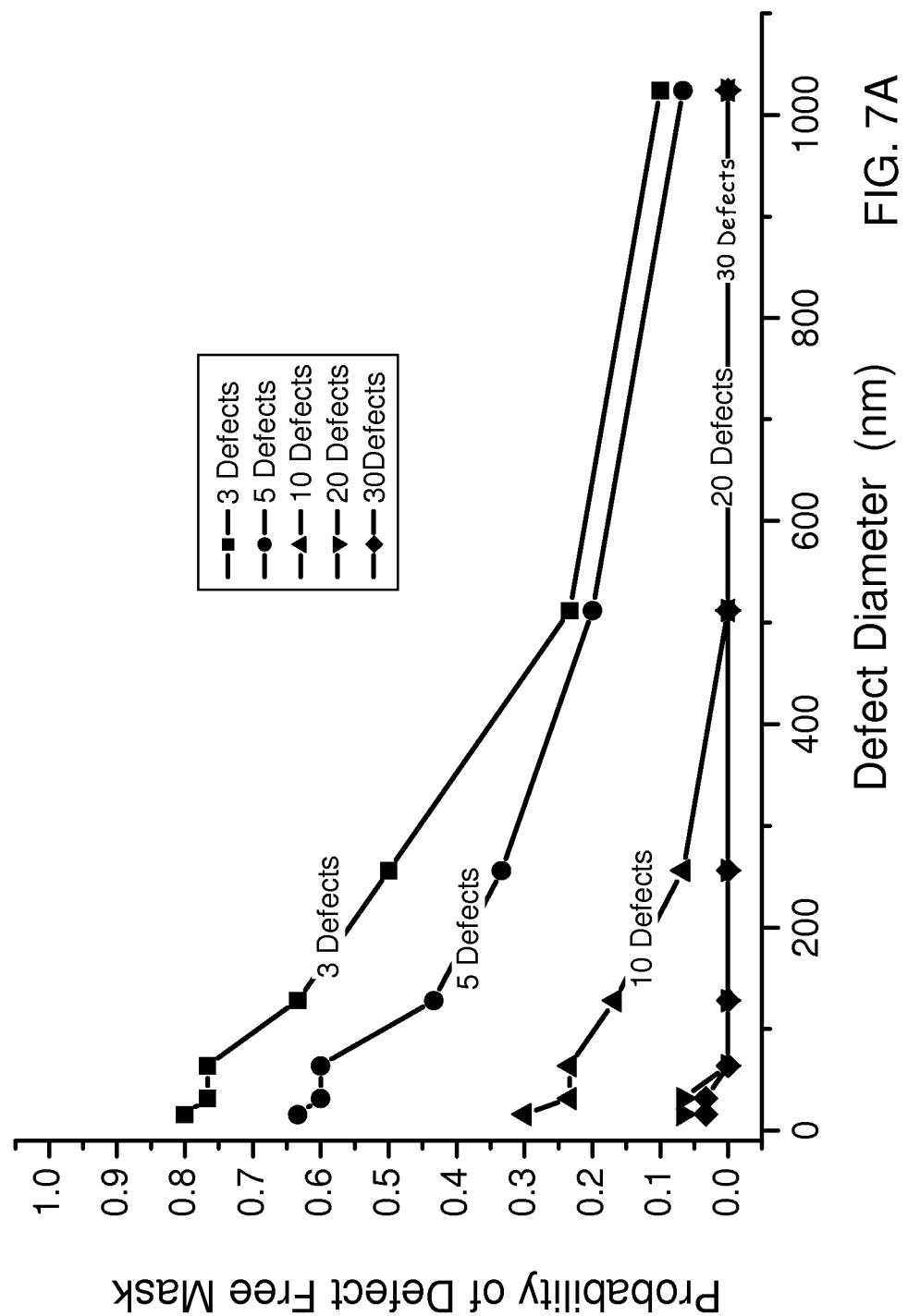
FIG. 7A is a graph illustrating the probability of producing a defect free mask without pattern shifting for a 45 nm node contact level mask pattern having an average reflective (open) area of 8.3%.
Figure 7B:
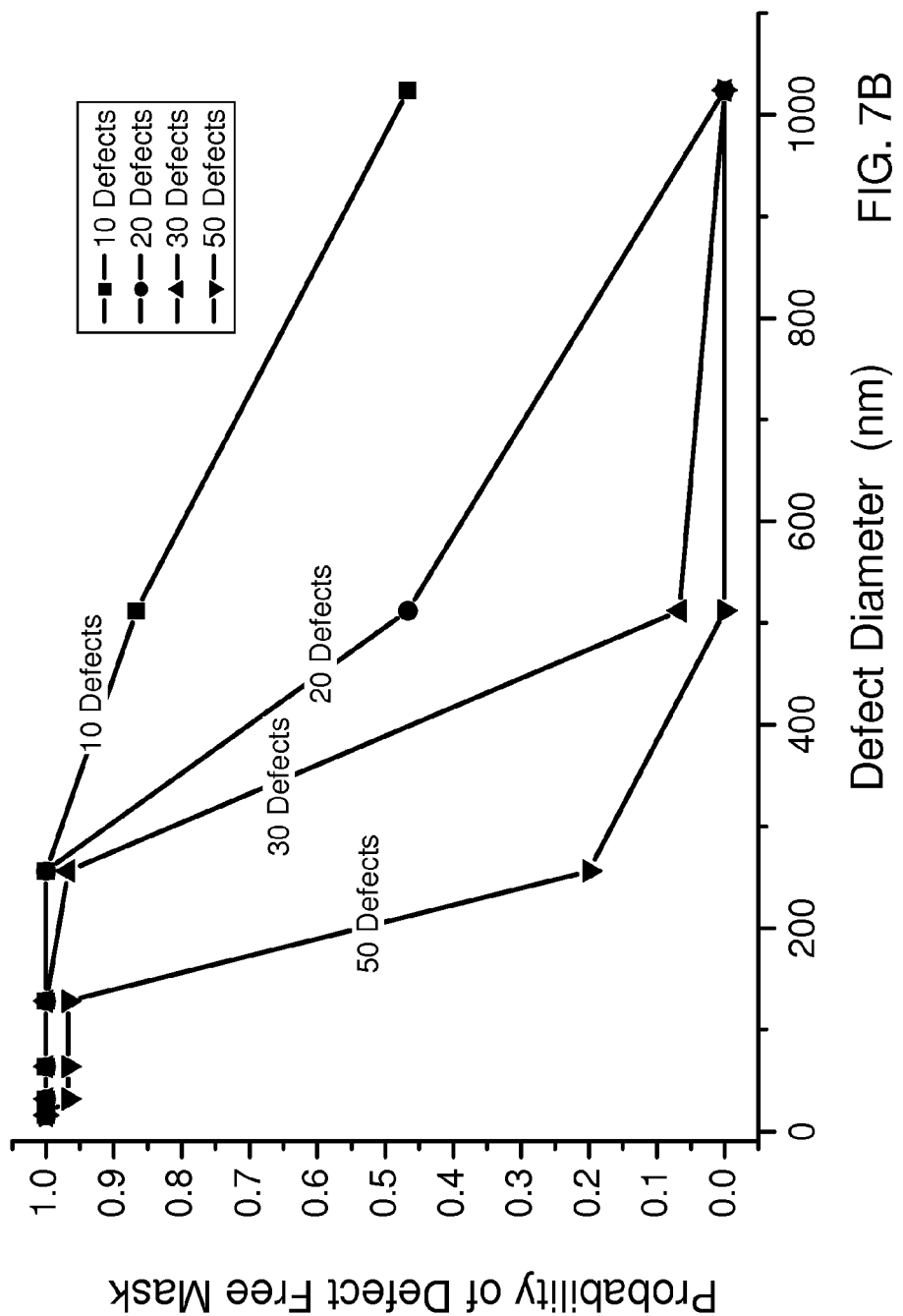
FIG. 7B is a graph illustrating the probability of producing a defect free mask with pattern shifting for the 45 nm node contact level mask pattern employed to generate the graph of FIG. 7A.

FIG. 7A is a graph illustrating the probability of producing a defect free mask without pattern shifting for a 45 nm node contact level mask pattern having an average reflective (open) area of 8.3%. FIG. 7B is a graph illustrating the probability of producing a defect free mask with pattern shifting for the 45 nm node contact level mask pattern employed to generate the graph of FIG. 7A. FIGS. 7A and 7B show results similar to the results in FIGS. 6A and 6B. Again, pattern shifting results in a dramatic improvement in the defect limited mask yield. In this case however, the yields with pattern shifting are not quite as large as obtained for the via level mask, i.e., fewer defects can be mitigated. While pattern shifting has significantly improved mask yield over the case without pattern shifting as illustrated in FIG. 7A, only roughly half as many defects are mitigated in the graph of FIG. 7B compared to the mitigation illustrated in FIGS. 6A and 6B.

Figure 8A:
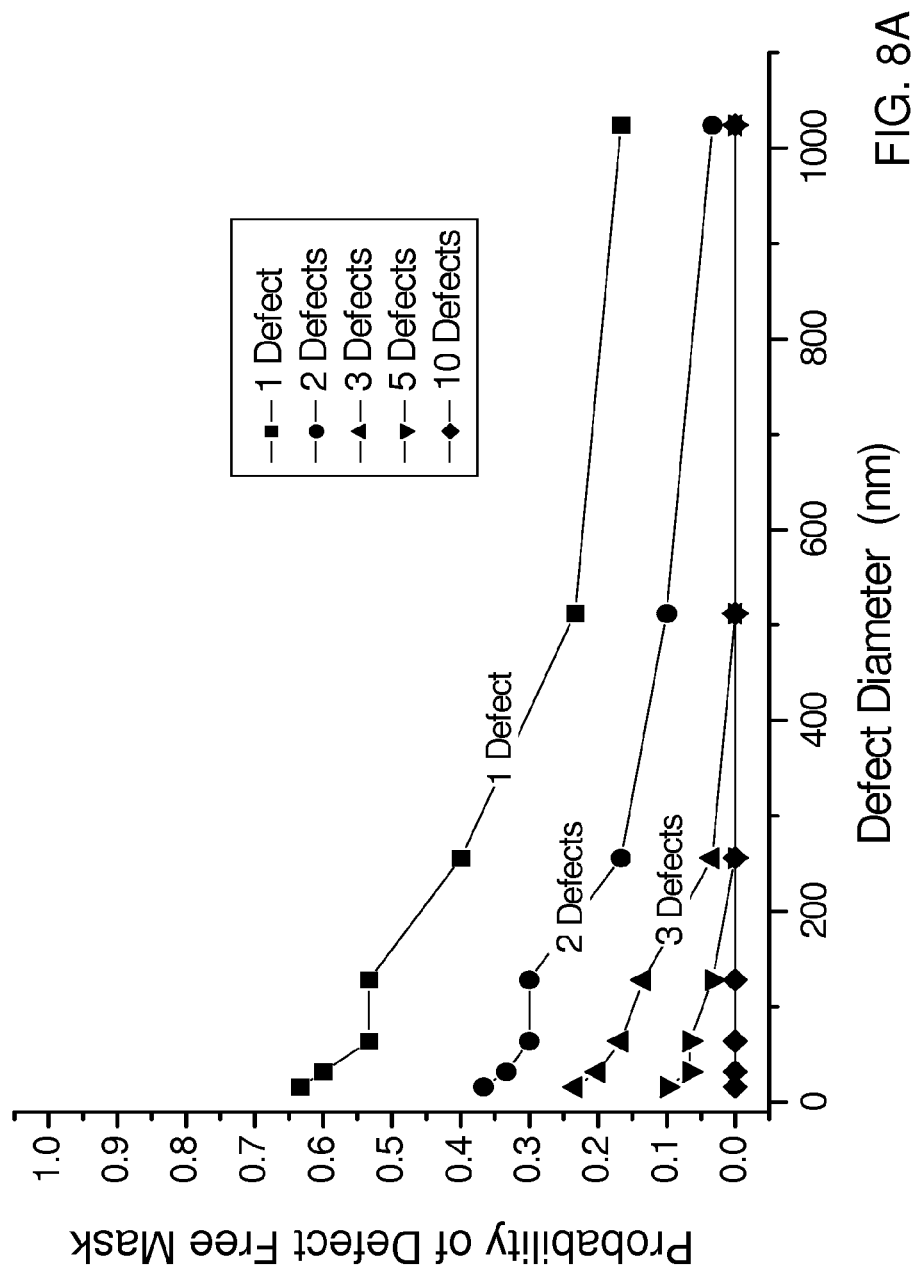
FIG. 8A is a graph illustrating the probability of producing a defect free mask without pattern shifting for a 45 nm node metal line level mask pattern having an average reflective (open) area of 33.1%.
Figure 8B:
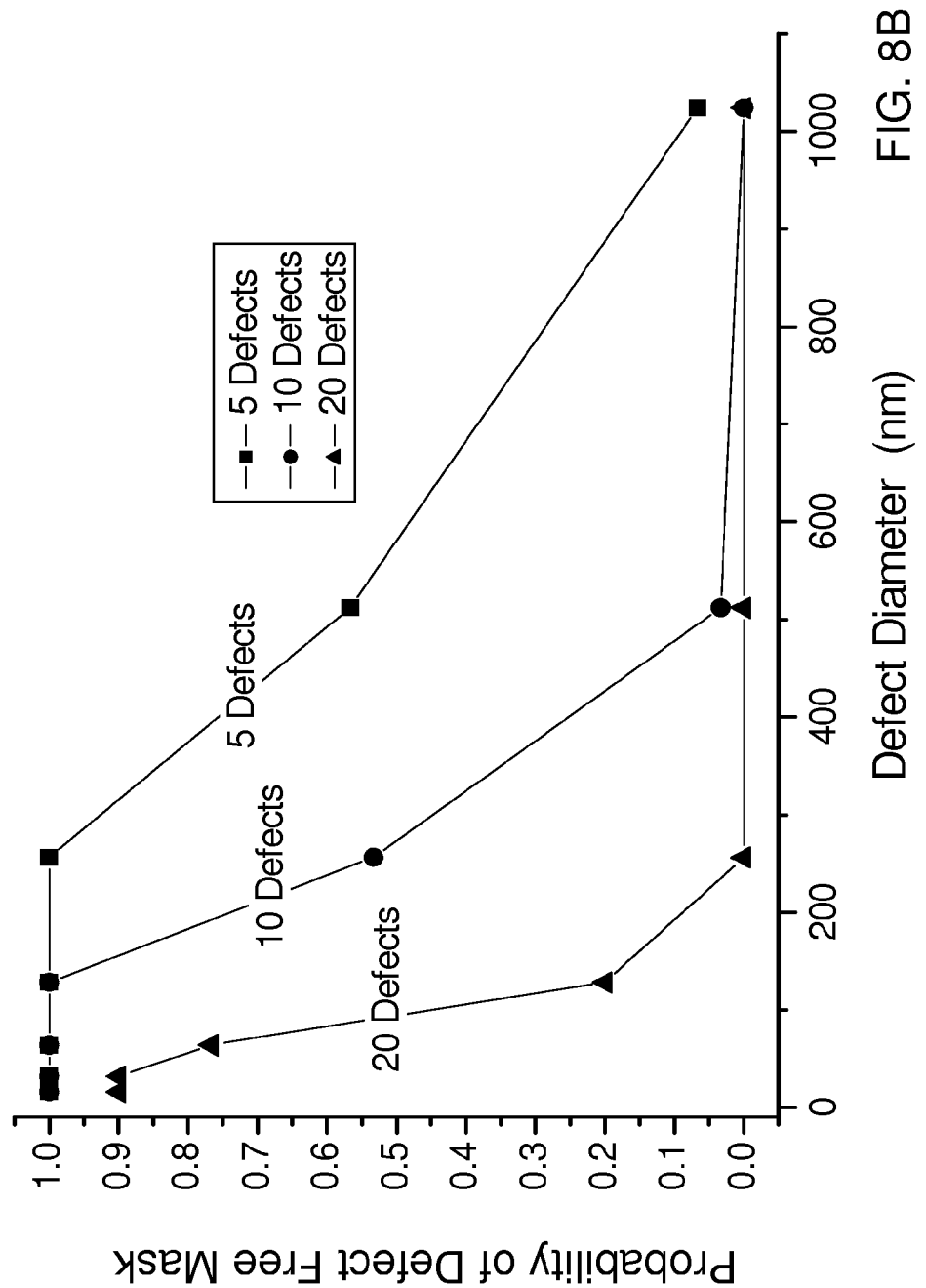
FIG. 8B is a graph illustrating the probability of producing a defect free mask with pattern shifting for the 45 nm node metal line level mask pattern employed to generate the graph of FIG. 8A.

FIG. 8A is a graph illustrating the probability of producing a defect free mask without pattern shifting for a 45 nm node metal line level mask pattern having an average reflective (open) area of 33.1%. FIG. 8B is a graph illustrating the probability of producing a defect free mask with pattern shifting for the 45 nm node metal line level mask pattern employed to generate the graph of FIG. 8A. FIGS. 8A and 8B show the mask yield for a 45 nm first level metal pattern with an average reflective area of 33.1% with and without pattern shifting, respectively. While pattern shifting has again significantly improved the mask yield, the number of defects that can be mitigated is noticeably less than that demonstrated for the via or contact results shown in FIGS. 6A, 6B, 7A, and 7B. In general, it has been observed in the course of the research leading to the present disclosure that mask yield with or without pattern shifting decreases as the average reflective area of the pattern increases. Both the number and the size of the defects that can be mitigated by pattern shifting decreases as the average reflective (open) area of the mask pattern increases. This behavior is consistent with the analysis outlined in Eqs. (1)-(5). In general, the efficacy of pattern shifting decreases as the average reflective (open) area increases.

In general, defects can occur in virtually any shape. To estimate the impact of defect shape on mask yield, oval defects with a 4 to 1 aspect ratio were modeled in addition to circular defects. Three orientations of the oval defects (major axis at 0, 45, and 90 degrees) were considered. Since the area of all defects was kept constant, any change in mask yield can only be attributed to defect shape and orientation. Calculations were performed for both a 45 nm node contact level mask pattern and a 45 nm node metal line level mask pattern.

Figure 9A:
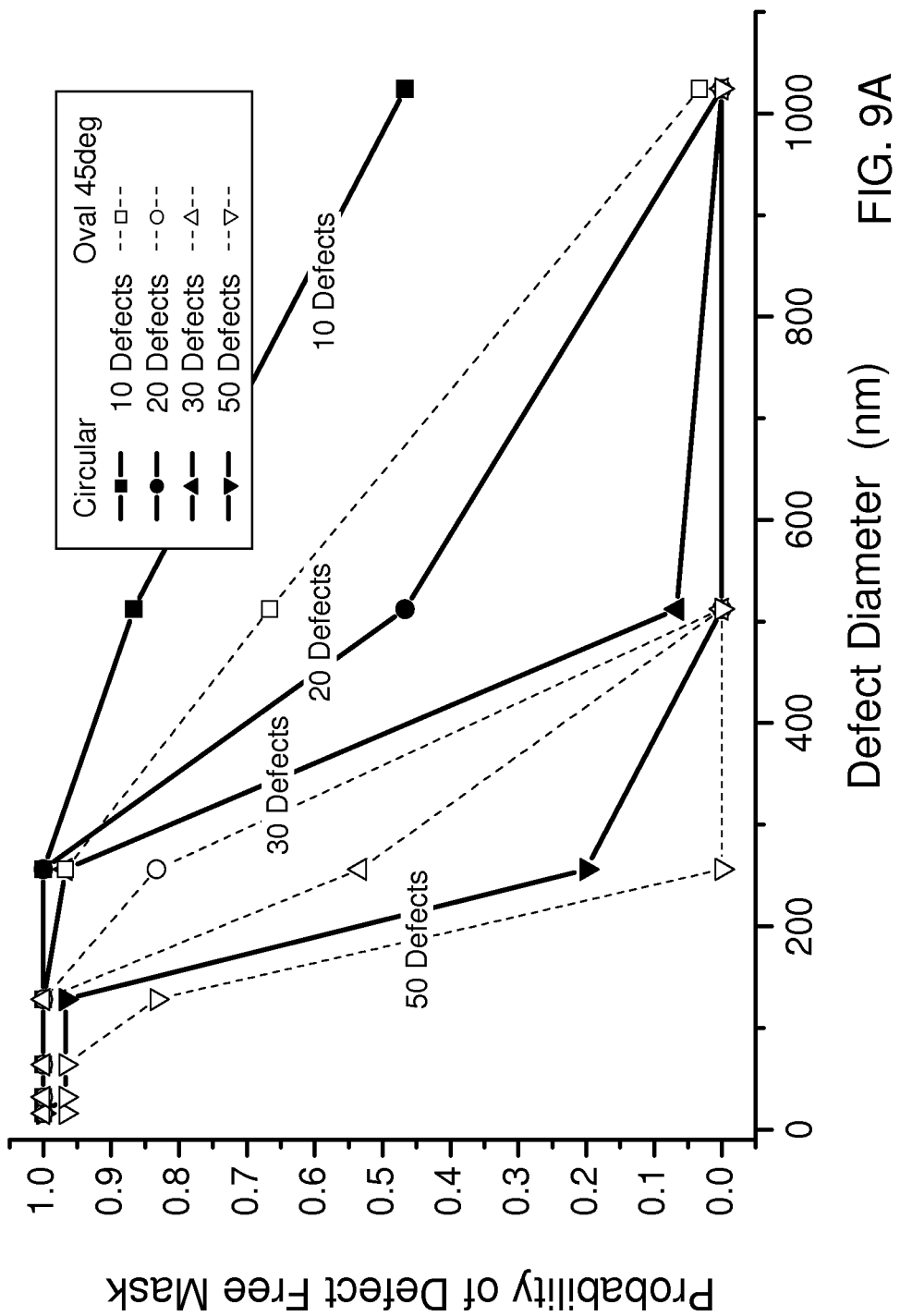
FIG. 9A is a graph illustrating the effect of defect shape on the effectiveness of mitigation of defects.
Figure 9B:
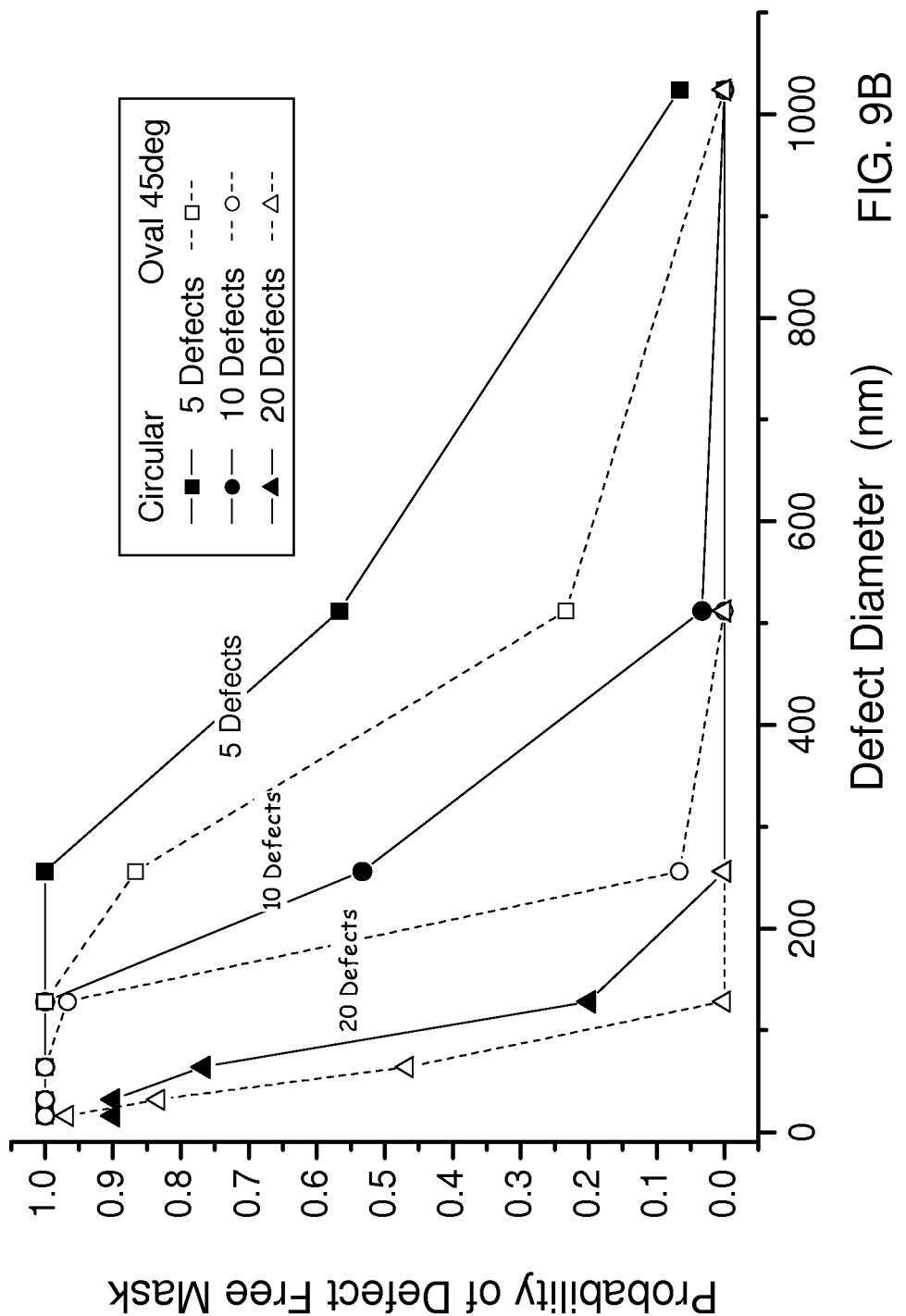
FIG. 9B is another graph illustrating the effect of defect shape on the effectiveness of mitigation of defects.

FIG. 9A is a graph illustrating the effect of defect shape on the effectiveness of mitigation of defects. In FIG. 9A, the mask yields for circular defects and oval defects with a 4 to 1 aspect ratio are compared for a 45 nm node contact level pattern. FIG. 9B is another graph illustrating the effect of defect shape on the effectiveness of mitigation of defects. In FIG. 9B, the mask yields for circular defects and oval defects with a 4 to 1 aspect ratio are compared for a 45 nm node metal line level pattern.

For clarity, only results for the circular and 45 degree oval defects are shown in FIGS. 9A and 9B. In all cases, for the same number and size (area) of defect, the mask yield is less for oval versus circular defects regardless of defect orientation. The same analysis was also performed on other mask levels and defect shapes. In general, defect mitigation is less effective for non-circular defects, and degrades as the ellipticity of the defects increases. In other words, as the ellipticity of the defects increases, the effectiveness of defect mitigation by pattern shifting decreases.

The previous calculations all assumed that the mask blank defects were randomly distributed spatially. While this is generally a reasonable assumption, there are cases where defects can occur in clusters. For example, during polishing of the fused silica substrate, a polishing scratch induced by a large grit particle can cause a series of closely spaced pits resulting in a defect cluster. Similarly, a cluster of bumps can occur from the evaporation of a water drop containing dissolved solids.

Figure 10:
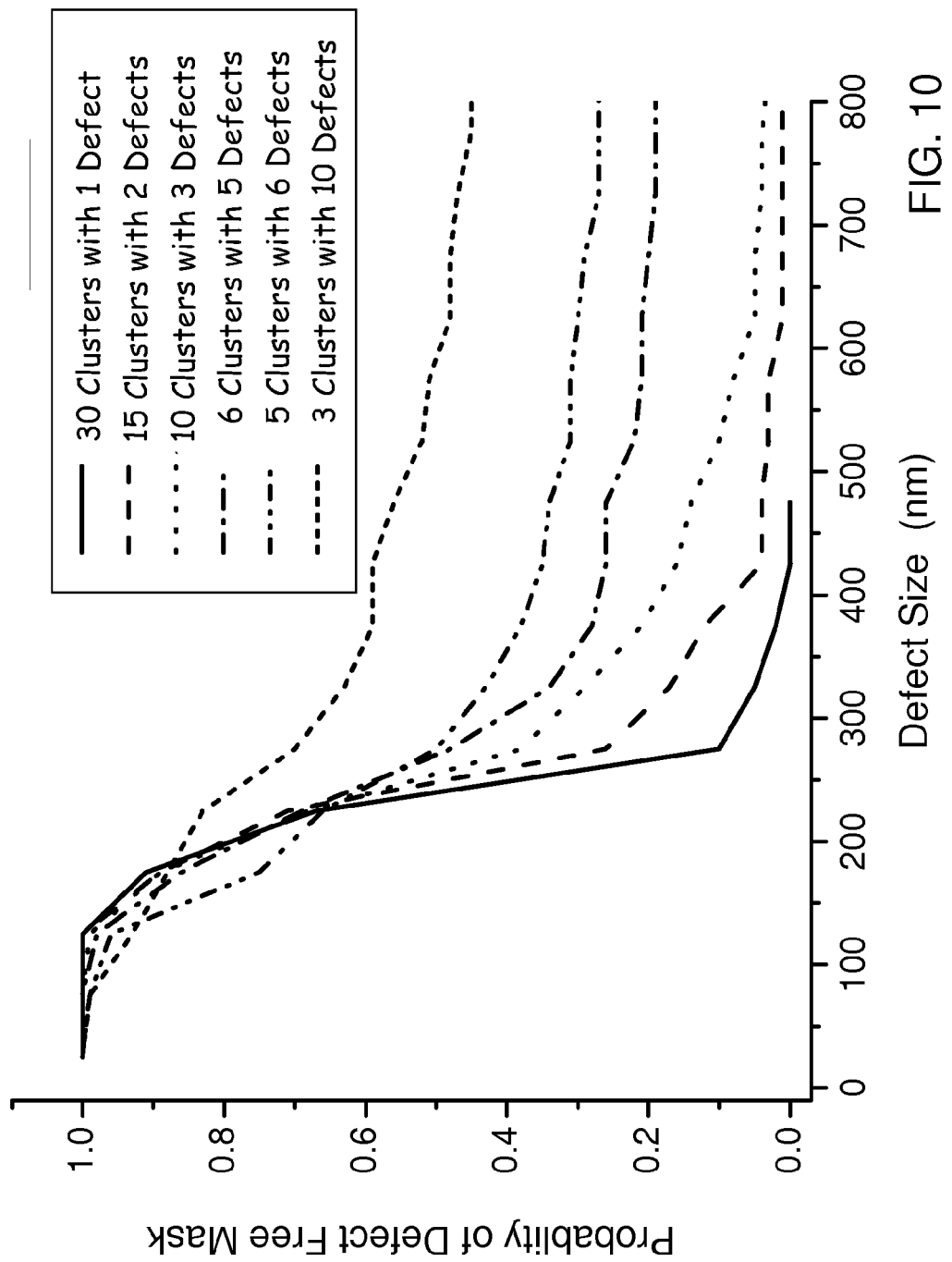
FIG. 10 is a graph illustrating the effect of defect clustering on mask yield. The total number of defects was held constant at 30, and the defects in each cluster were confined to a 1.6 micron region.

FIG. 10 is a graph illustrating the effect of defect clustering on mask yield. The total number of defects was held constant at 30, and the defects in each cluster were confined to a 1.6 micron region. As the number of defects in a cluster increases, defect mitigation by pattern shifting degrades slightly for small defects, but improves significantly for larger diameter defects. FIG. 10 shows the impact of defect clustering on mask yield for a 32 nm technology node via level. A total of 30 defects were simulated in each of 6 cases. The defect clusters ranged from 30 individual randomly placed defects (i.e. no clustering) to 3 randomly placed clusters each containing 10 defects. The location of the defects within a cluster was randomly chosen to fall inside a 1.6 um radius from the center of the cluster.

For defects less than approximately 250 nm in diameter, the mask yield decreases slightly with increasing clustering. This behavior can be explained by considering the neighborhood of a single via. As the number of defects clustered about a single via increases, the local defect density increases and it will become increasing difficult to find a local pattern shift which avoids all of these defects. As the defect size increases further, the mask yield improves with increasing clustering. This result may be attributed to "overlap" of the defects in a cluster; essentially the cluster begins behaving as a single large defect. This is consistent with the rather slow decrease in mask yield for highly clustered defects when the individual defect diameter is greater than ~300 nm compared to individual or sparsely clustered defects.

Certain photomask levels typically have greater than 50% average reflective area, i.e. mostly "open" areas on the mask. As described herein, as the reflective area of the mask increases, the defect limited mask yield and the efficacy of pattern shifting decreases. Since the average reflective area can exceed 60% or more for isolation and gate level masks, significant defect mitigation by pattern shifting will be difficult. However, the average reflective area can be reduced by inverting the tone of the mask coupled with inverting the tone of the resist used for the wafer exposure.

Figure 11B:
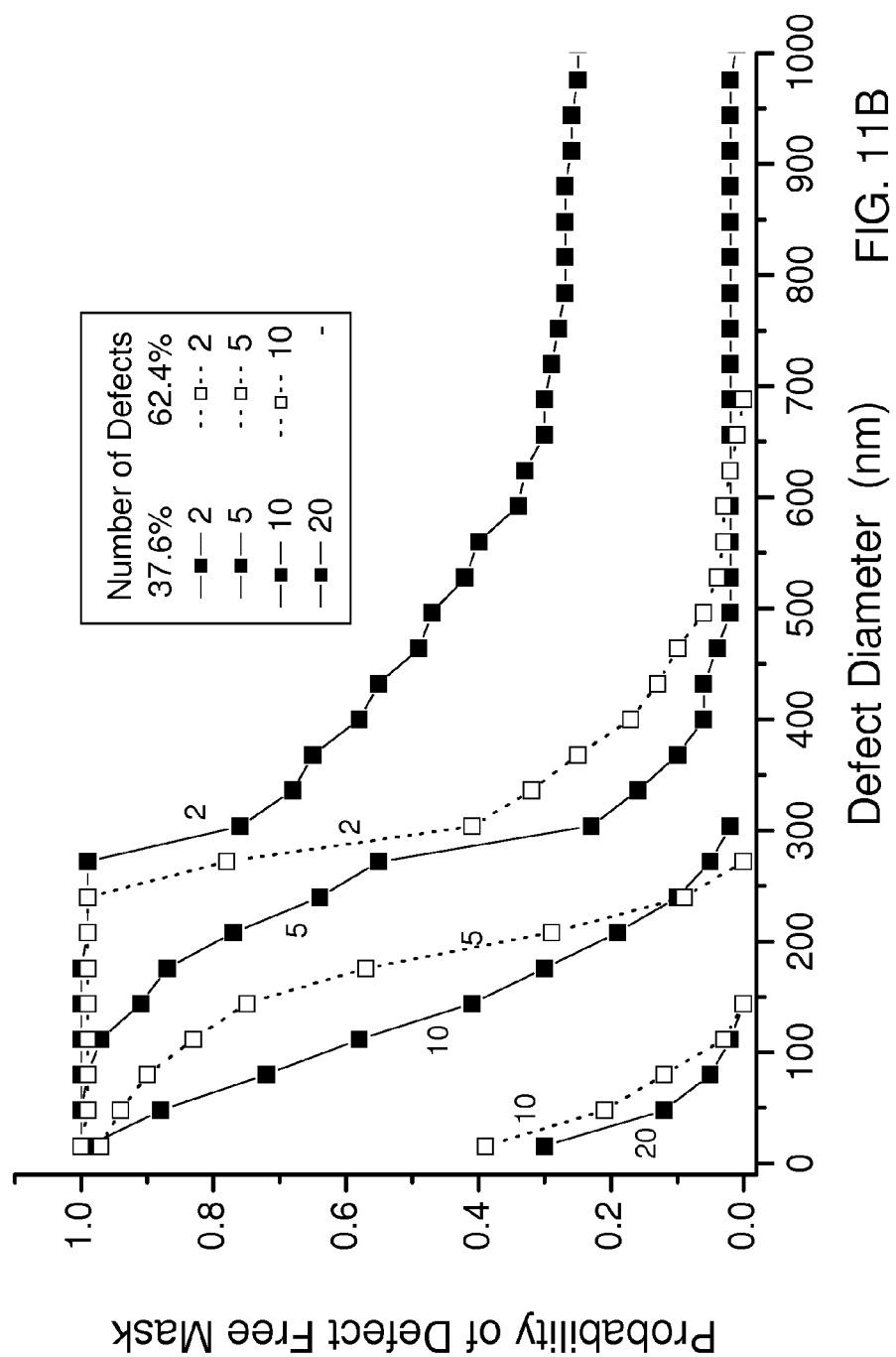
FIG. 11B is a graph illustrating the impact on defect mitigation of inverting the tone of the mask pattern of a 32 nm node recessed oxide (RX) isolation level mask pattern having an average reflective area greater than 50%.

FIGS. 11A and 11B show the impact of inverting the tone of a mask on the mask yield for a 32 nm microprocessor design. FIG. 11A is a graph illustrating the impact on defect mitigation of inverting the tone of the mask pattern of a 32 nm node gate conductor (GC) level mask pattern having an average reflective area of 62.4%. Specifically, the yield (the probability of a defect free mask) after pattern shifting is shown for a GC level mask pattern with average reflective areas of 37.6% (i.e., with tone inversion) and a GC level mask pattern with average reflective areas of 62.4% (i.e., without tone inversion). The solid lines are the results for the tone inverted mask, while the dashed lines correspond to the normal mask tone. Reducing the average reflective area on the mask through tone inversion allows roughly a twofold increase in the number of defects that can be mitigated.

FIG. 11B is a graph illustrating the impact on defect mitigation of inverting the tone of the mask pattern of a 32 nm node recessed oxide (RX) isolation level mask pattern having an average reflective area 62.6%. Specifically, the yield (the probability of a defect free mask) after pattern shifting is shown for RX isolation level mask pattern with average reflective areas of 37.4% (i.e., with tone inversion) and a GC level mask pattern with average reflective areas of 62.6% (i.e., without tone inversion). The solid lines are the results for the tone inverted mask, while the dashed lines correspond to the normal mask tone. Reducing the average reflective area on the mask through tone inversion allows roughly a twofold increase in the number of defects that can be mitigated.

In FIGS. 11A and 11B, tone inversion improves mask yield as expected, for example by increasing the number of defects that can be mitigated by approximately a factor of 2.

Figure 12:
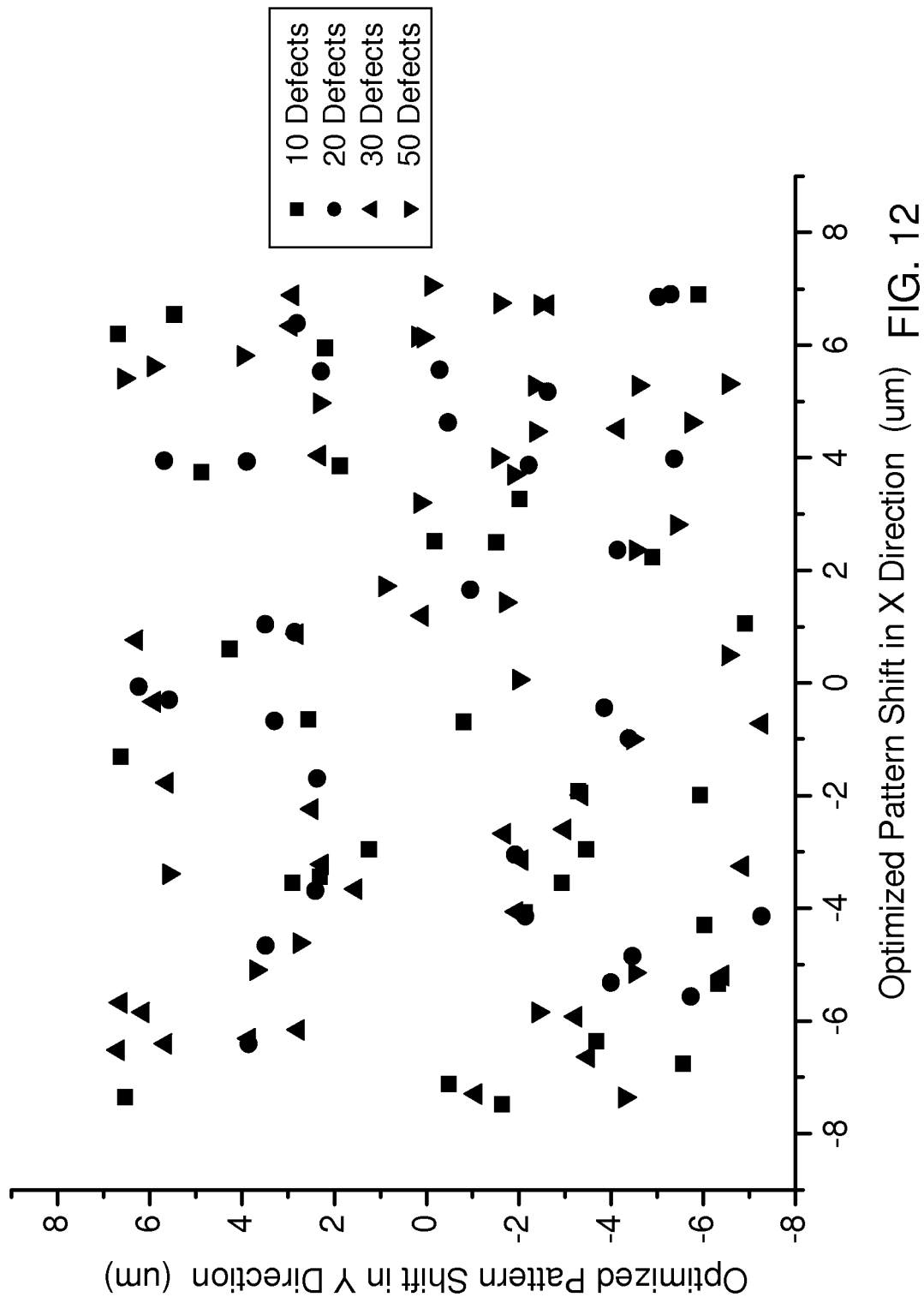
FIG. 12 is a graph illustrating the distribution of optimal pattern shifts calculated for a 45 nm node contact pattern with 10 to 50 blank defects.

By analyzing a large number of cases for a particular pattern, the distribution of optimal pattern shifts has been determined. Since the defects are randomly located, no preference in both the magnitude and direction of the optimal pattern shift is expected. FIG. 12 shows the optimal pattern shifts obtained for a 45 nm node contact level with 10 to 50 defects. The shift was limited to a maximum of +/−8 microns. Analysis of the results show the distribution of pattern shifts is random, as expected. In this case, the maximum pattern shift was limited to a 16 um field, i.e. +/−8 microns. No pattern shift would correspond to a point centered at (0,0) in FIG. 12. A radial analysis of the points in FIG. 12 confirms that the distribution is random in both magnitude and direction as expected.

Figure 13:
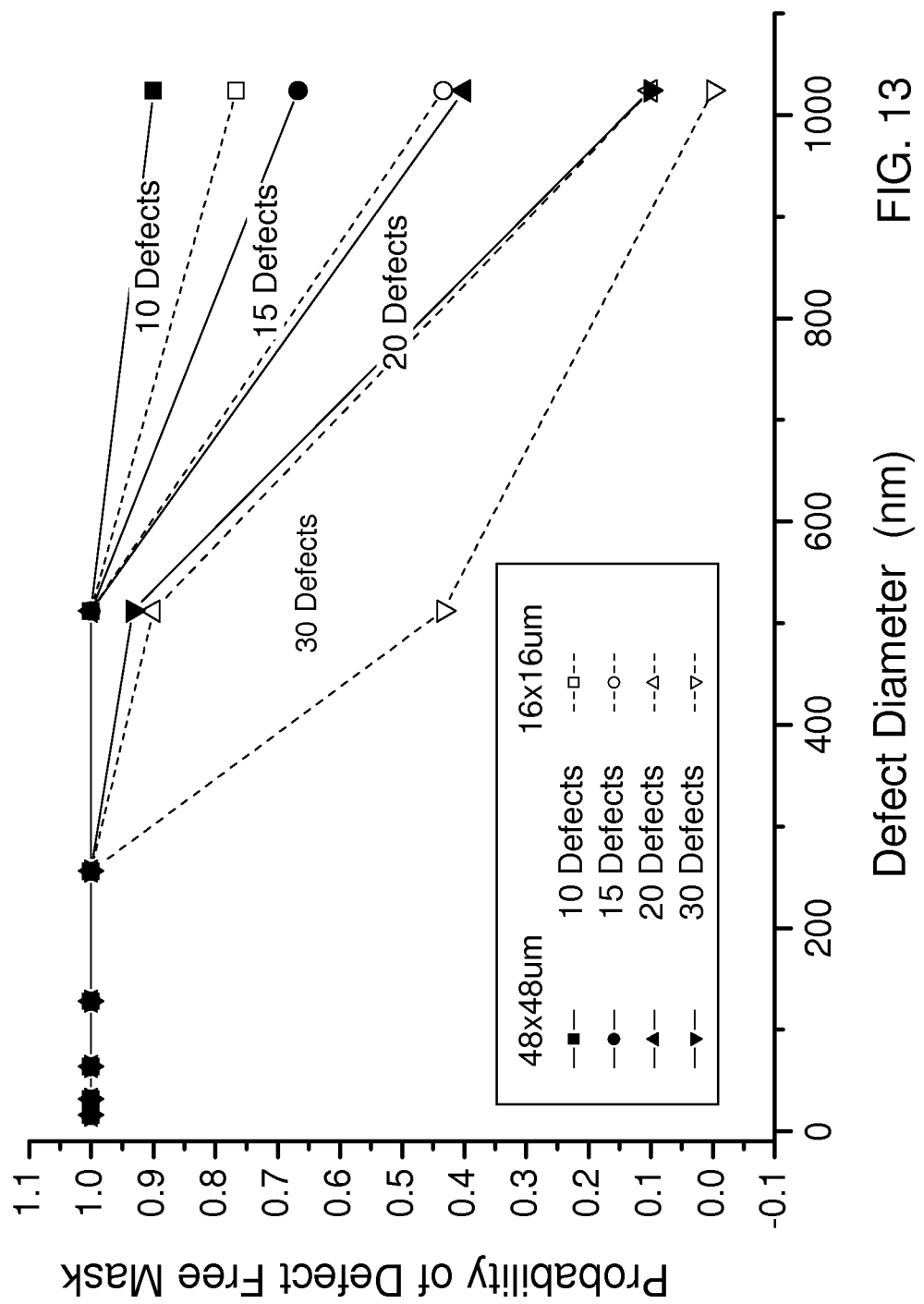
FIG. 13 is a graph illustrating the effect of the maximum allowable shift on defect mitigation.

In all of the examples shown thus far, the maximum size of the pattern shift was limited to 16 μm. An estimate of the impact of allowable pattern shift magnitude is shown in FIG. 13. FIG. 13 is a graph illustrating the effect of the maximum allowable shift on defect mitigation. The solid line and dashed lines corresponds to a 48 micron and a 16 micron maximum pattern shift, respectively. A 45 nm node contact level was modeled using either a 48 um (solid line) or a 16 um (dashed line) maximum allowed pattern shift.

Increasing the maximum allowable pattern shift improves the mask yield. Comparison of the solid and dashed lines in FIG. 13 shows that a threefold increase in the maximum shift (ninefold increase in area) allows an increase of approximately 30% to 50% in the number of defects that can be mitigated of a given size. Constraints in the EUV lithography tool will likely limit the maximum allowable pattern shift to several hundred microns. Increasing the maximum allowable shift to several hundred microns can result in a significant increase in the number of defects that can be mitigated, for example, by as much as a factor of 10 over the numbers reported in this article for a 16 μm maximum pattern shift.

As illustrated above, pattern shifting can significantly improve mask yield, particularly for mask patterns which have a small average reflective area and defects whose size is comparable or smaller than the typical mask features. While the major variables affecting mask yield are the average reflective area in the mask pattern, and the size and number of defects, defect shape as well as clustering of defects also affects mask yield.

The method of pattern shifting can be implemented employing a mask blank inspection system configured to locate defects. In one embodiment, the mask blank inspection system can be configured to measure the size and location of each measurable defect. Additionally, the mask blank inspection system may be configured to measure clustering and/or shape of the defects. As EUV blank quality improves, the number and size distribution of defects can be monitored to determine the effectiveness of pattern shifting for defect mitigation.

Figure 14:
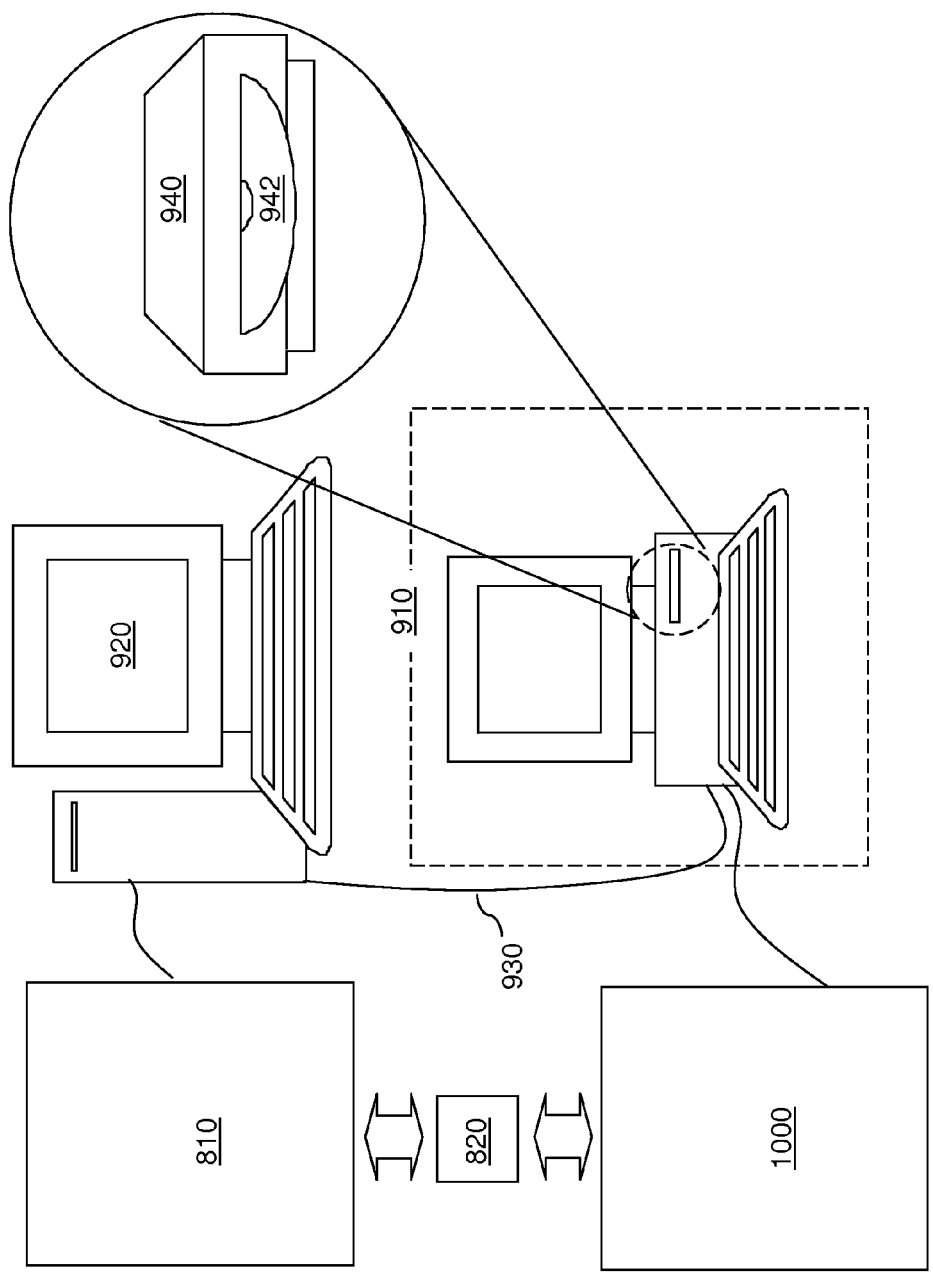
FIG. 14 is an exemplary system that can be employed to determine a shift vector for a given mask blank and a mask pattern and the corresponding relative orientation between the mask blank and the mask pattern for the shift vector, and/or for manufacturing a patterned mask from the mask blank employing the determined shift vector.

Referring to FIG. 14, a system can be provided for manufacturing a patterned mask from a mask blank. The system can include at least one computing means 910, which can be a computer or any computing device known in the art. The at least one computing means 910 includes a processor and a memory that are configured to run an automated program. The at least one computing means 910 can be in communication with a database 920, which can be a standalone computing means or can be incorporated into the at least one computing means 910. If the database 920 is a standalone computing means, a data cable 930 or wireless communication can be employed to transfer data between the database 920 and the at least one computing means 910.

The system further includes a non-transitory machine-readable data storage medium, which can be embedded within the at least one computing means 910, can be present within the database 920, or can be provided as a portable non-transitory machine-readable data storage medium 942 that can be accessed employing a data-writing device 940, which can optionally perform the task of reading data from the portable non-transitory machine-readable data storage medium 942. The database 920 can store design layouts. If the database 920 is not provided, design layouts can be stored in the at least one computing means 910.

The system further includes a mask inspection tool 810 configured to detect defects having a size above a threshold size on a mask blank 820. Specifically, the mask blank 820 can be loaded into the mask inspection tool 810 and inspected to identify the center location and the lateral dimensions in at least two directions (which can be perpendicular to each other as in the combination of an x-direction and a y-direction that is within the plane of the mask blank) for each measured (i.e., detected) defects on the mask blank. The information on the center location and the lateral dimensions can be transmitted to the database 920 and subsequently to the at least one computing means 910, or can be transmitted directly to the at least one computing means 910.

The at least one computing means 910 can be employed to perform at least one or all steps illustrated in FIG. 4. The at least one computing means 910 can be configured to perform the various steps in FIGS. 4A-4J automatically without human intervention once a design layout including the mask pattern to be written on the blank mask. Intermediate results and/or final results derived from any of the steps of FIGS. 4A-4J can be stored in at least one non-transitory machine-readable data storage medium that can be provided within the at least one computing means 910 and/or within at least one non-transitory machine-readable data storage medium provided within the database 920. The non-transitory machine-readable data storage medium may be of any type known in the art.

One or more non-transitory machine readable medium within the at least one computing means 910 and/or the database 920 can be a portable non-transitory machine-readable data storage medium 942 such as a CD ROM or a DVD ROM. A data-writing device 940 may be provided in the at least one computing means 910 or within the database 920 to enable storage of any data derived from the steps of FIGS. 4A-4J.

In one embodiment, the automated program can include steps of: overlaying an image of a mask pattern over an image of a mask blank annotated with a center location and at least one dimension parameter of measured mask defects; generating design clips centered at each of the measured defects and having a same design clip size and a same design clip shape from the image of the mask pattern; generating a binary pixel image for each of the design clips; logically compiling, pixel by pixel, the generated binary pixel images to generate a composite pixel map; and determining, from the composite pixel map, presence or absence of an optimal pattern shift vector representing a lateral shift of the mask blank from a position at the overlaying, the lateral shift being selected to eliminate or minimize an impact of the measured mask defects during a lithographic process. The automated program can further includes a step of identifying, from the composite pixel map, an optimal pattern shift vector representing a lateral shift of the mask blank from a position at the overlaying, the lateral shift being selected to eliminate or minimize an impact of the measured mask defects during a lithographic process.

Thus, the system can be employed to determine optimal placement of the mask pattern with respect to the mask blank. The non-transitory machine readable data storage medium provided within the system is in communication with the at least one computing means 930 and can be configured to store information on the optimal pattern shift vector therein.

The system further includes a mask writing tool 1000 in communication with the computing means and configured to load the mask blank 820 and to align the mask blank 820 in the mask writing tool 1000 with a physical offset corresponding to the optimal pattern shift vector V, and configured to print, with the physical offset, the image of the mask pattern on the mask blank to convert the mask blank into a patterned mask.

While the disclosure has been described in terms of specific embodiments, it is evident in view of the foregoing description that numerous alternatives, modifications and variations will be apparent to those skilled in the art. Various embodiments of the present disclosure can be employed either alone or in combination with any other embodiment, unless expressly stated otherwise or otherwise clearly incompatible among one another. Accordingly, the disclosure is intended to encompass all such alternatives, modifications and variations which fall within the scope and spirit of the disclosure and the following claims.

What is claimed is:

1. A method for determining placement of a mask pattern with respect to a mask blank, said method comprising:
   overlaying an image of a mask pattern over an image of a mask blank annotated with a center location and at least one dimension parameter of each of measured mask defects;

generating design clips centered at each of said measured mask defects and having a same design clip size and a same design clip shape from said image of said mask pattern;

generating a binary pixel image for each of said design clips;

logically compiling, pixel by pixel, said generated binary pixel images to generate a composite pixel map; and identifying, from said composite pixel map, presence or absence of a pattern shift vector representing a lateral shift of said mask blank from a position at said overlaying, said lateral shift being selected to eliminate or minimize an impact of said measured mask defects during a lithographic process employing a pattern mask generated from said mask blank and including said mask pattern, wherein a computing means configured to run an automated program performs at least one of said overlaying, said generating said design clips, said generating said binary pixel images, said logically compiling, and said determining.

2. The method of claim 1, wherein each of said binary pixel image is generated by:

selecting a design clip among said design clips; and applying at least one lateral bias that is proportional to a lateral dimension of a mask defect within a same area as said selected design clip to expand shapes representing defect-activating regions in a patterned mask.

3. The method of claim 2, wherein said expanding shapes representing defect-activating regions comprises:

expanding said shapes along a first direction that is perpendicular to first edges of said shapes that are parallel among one another by a first lateral bias; and expanding said shapes along a second direction that is perpendicular to second edges of said shapes that are parallel among one another and perpendicular to said first edges by a second lateral bias.

4. The method of claim 3, wherein said first lateral bias is one half of a maximum dimension of said mask defect within said same area as said selected design clip along said first direction, and said second lateral bias is one half of a maximum dimension of said mask defect within said same area as said selected design clip along said second direction.

5. The method of claim 2, wherein said mask blank is a extreme ultraviolet (EUV) mask blank comprising a blanket EUV absorbing layer, and said defect-activating regions are reflective regions in said patterned mask.

6. The method of claim 2, wherein said mask blank is a deep ultraviolet (DUV) mask blank comprising a blanket opaque layer, and said defect-activating regions are transparent regions in said patterned mask.

7. The method of claim 1, wherein said logically compiling said generated binary pixel images to generate a composite pixel map comprises performing a bit-by-bit "OR" operation or a bit-by-bit "AND" operation on said generated binary pixel images.

8. The method of claim 1, wherein said generating binary pixel images comprises:

assigning a "1" value to each pixel in said generated binary pixel images that represents a defect-activating region; and assigning a "0" value to each pixel in said generated binary pixel images that represents a defect-hiding region, and said logically compiling of said generated binary pixel images to generate a composite pixel map comprises performing a bit-by-bit "OR" operation on said generated binary pixel images.

9. The method of claim 8, wherein said identifying presence or absence of a pattern shift vector comprises identifying at least one pixel having a "0" value from said composite pixel map.

10. The method of claim 1, wherein said generating binary pixel images comprises:

assigning a "0" value to each pixel in said generated binary pixel images that represents a defect-activating region; and assigning a "1" value to each pixel in said generated binary pixel images that represents a defect-hiding region, and said logically compiling said generated binary pixel images to generate a composite pixel map comprises performing a bit-by-bit "AND" operation on said generated binary pixel images.

11. The method of claim 10, wherein said identifying presence or absence of a pattern shift vector comprises identifying at least one pixel having a "1" value from said composite pixel map.

12. The method of claim 1, wherein said generating binary pixel images comprises:

assigning a "1" value to each pixel in said generated binary pixel images that represents a defect-activating region; and assigning a "0" value to each pixel in said generated binary pixel images that represents a defect-hiding region, and said logically compiling said generated binary pixel images to generate said composite pixel map comprises performing a bit-by-bit numerical addition operation on said generated binary pixel images to generate said composite pixel map as a grey-scale map.

13. The method of claim 12, wherein said identifying presence or absence of a pattern shift vector comprises identifying at least one pixel having a least numerical value within said grey-scale map.

14. The method of claim 1, wherein said generating binary pixel images comprises:

assigning a "0" value to each pixel in said generated binary pixel images that represents a defect-activating region; and assigning a "1" value to each pixel in said generated binary pixel images that represents a defect-hiding region, and said logically compiling said generated binary pixel images to generate said composite pixel map comprises performing a bit-by-bit numerical addition operation on said generated binary pixel images to generate said composite pixel map as a grey-scale map.

15. The method of claim 14, wherein said identifying presence or absence of a pattern shift vector comprises identifying at least one pixel having a greatest numerical value within said grey-scale map.

16. The method of claim 1, further comprising selecting said same design clip size and said same design clip shape so that a magnitude of any vector from a geometrical center of a measured defect to any point on a periphery of a design clip including said measured defect is less than a maximum allowable movement of said image of said mask pattern relative to said mask blank along a direction of said any vector.

17. The method of claim 16, wherein said same design clip shape is a rectangular shape having a first set of sides that are parallel to first edges of shapes within said mask pattern and a second set of sides that are parallel to second edges of shapes within said mask pattern.

18. The method of claim 1, further comprising overlaying a rotated image of said mask pattern within said image of said annotated mask blank;

generating additional design clips centered at each of said measured mask defects and having a same design clip size and a same design clip shape from said rotated image of said mask pattern;

generating an additional binary pixel image for each of said additional design clips;

logically compiling, pixel by pixel, said generated additional binary pixel images to generate an additional composite pixel map;

determining, from said additional composite pixel map, presence or absence of an additional pattern shift vector representing a lateral shift of said rotated image of said mask pattern from a position at said overlaying of said rotated image, said lateral shift being selected to eliminate or minimize an impact of said measured mask defects during a lithographic process; and comparing information on said pattern shift vector and said additional pattern shift vector to select a pattern shift vector that provides greater suppression of effects of said measured mask defects.

19. The method of claim 18, wherein a selection of said pattern shift vector that provides greater suppression of effects of said measured defects is effected by:

iteratively removing outermost peripheral pixels from pixel clusters representing a minimum or a maximum in pixel values of said composite pixel map and said additional composite pixel map until a last remnant of said pixel clusters has a width not greater than two pixels; and selecting a center point of a composite pixel map including said last remnant as a beginning point of said selected pattern shift vector and selecting a point of among said remnant as an end point of said selected pattern shift vector.

20. The method of claim 18, wherein a rotation angle between said rotated image of said mask pattern and said image of said mask pattern is selected from 90 degrees, 180 degrees, and 270 degrees.

21. The method of claim 18, wherein a rotation angle between said rotated image of said mask pattern and said image of said mask pattern is selected from a range from −15 degrees to +15 degrees that excludes 0 degrees, a range from 75 degrees to 105 degrees that excludes 90 degrees, a range from 165 degrees to 195 degrees that excludes 180 degrees, and a range from 255 degrees to 285 degrees that excludes 270 degrees.

22. A method of manufacturing a patterned mask from a mask blank using a manufacturing tool, said method comprising:

overlaying an image of a mask pattern over an image of a mask blank annotated with a center location and at least one dimension parameter of each of measured mask defects;

generating design clips centered at each of said measured mask defects and having a same design clip size and a same design clip shape from said image of said mask pattern;

generating a binary pixel image for each of said design clips;

logically compiling, pixel by pixel, said generated binary pixel images to generate a composite pixel map;

identifying, from said composite pixel map, a pattern shift vector representing a lateral shift of said mask blank from a position at said overlaying, said lateral shift being selected to eliminate or minimize an impact of said measured mask defects during a lithographic process;

loading said mask blank into a mask writing tool;

aligning said mask blank in said mask writing tool with a physical offset corresponding to said pattern shift vector; and printing, with said physical offset, said image of said mask pattern on said mask blank to convert said mask blank into a patterned mask.

23. The method of claim 22, wherein each of said binary pixel images is generated by:

selecting a design clip among said design clips; and applying at least one lateral bias that is proportional to a lateral dimension of a mask defect within a same area as said selected design clip to expand shapes representing defect-activating regions in a patterned mask.

24. The method of claim 23, wherein said expanding shapes representing defect-activating regions comprises:

expanding said shapes along a first direction that is perpendicular to first edges of said shapes that are parallel among one another by a first lateral bias; and expanding said shapes along a second direction that is perpendicular to second edges of said shapes that are parallel among one another and perpendicular to said first edges by a second lateral bias.

25. The method of claim 24, wherein said first lateral bias is one half of a maximum dimension of said mask defect within said same area as said selected design clip along said first direction, and said second lateral bias is one half of a maximum dimension of said mask defect within said same area as said selected design clip along said second direction.

* * * * *